(12) United States Patent
Matsushita et al.

(10) Patent No.: US 6,930,906 B2
(45) Date of Patent: Aug. 16, 2005

(54) FERROELECTRIC MEMORY AND OPERATING METHOD THEREFOR, AND MEMORY DEVICE

(75) Inventors: Shigeharu Matsushita, Katano (JP); Yoh Takano, Ogaki (JP); Satoru Sekine, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 144 days.

(21) Appl. No.: 10/387,869

(22) Filed: Mar. 14, 2003

(65) Prior Publication Data

US 2003/0174532 A1 Sep. 18, 2003

(30) Foreign Application Priority Data

Mar. 15, 2002 (JP) .................................... 2002-071148
May 27, 2002 (JP) .................................... 2002-152261
Feb. 27, 2003 (JP) .................................... 2003-050269

(51) Int. Cl.[7] ............................................. G11C 11/22
(52) U.S. Cl. ........................ 365/145; 365/117; 365/174; 365/175
(58) Field of Search ................................ 365/145, 117, 365/174, 175

(56) References Cited

U.S. PATENT DOCUMENTS 5,361,225 A * 11/1994 Ozawa ....................... 365/145
5,926,412 A * 7/1999 Evans et al. ................ 365/145

OTHER PUBLICATIONS

Oyo Buturi, vol. 67, No. 11(1998) pp. 1286–1289.

* cited by examiner

*Primary Examiner*—Anh Phung
*Assistant Examiner*—Pho M. Luu
(74) *Attorney, Agent, or Firm*—Arent Fox PLLC

(57) ABSTRACT

A ferroelectric memory capable of improving disturbance resistance in a non-selected memory cell includes a bit line, a word line arranged to intersect with the bit line, and a memory cell, which is arranged between the bit line and the word line an includes a ferroelectric capacitor and a diode serially connected to the ferroelectric capacitor. Thus, when a voltage in a range hardly feeding a current to the diode is applied to a non-selected cell in data writing or data reading, substantially no voltage is applied to the ferroelectric capacitor.

28 Claims, 18 Drawing Sheets

(Vc:coercive voltage)

FERROELECTRIC MEMORY AND OPERATING METHOD THEREFOR, AND MEMORY DEVICE

BACKGROUND OF THE INVENTION

1. Field of the Invention

The present invention relates to a ferroelectric memory and an operating method therefor as well as a memory device, and more particularly, it relates to a ferroelectric memory having a ferroelectric capacitor and an operating method therefor as well as a memory device having storage means.

2. Description of the Background Art

In recent years, a ferroelectric memory has been noted as a high-speed nonvolatile memory requiring low power consumption. Therefore, the ferroelectric memory is actively researched and developed.

FIG. 25 is a representative circuit diagram of a most generally employed conventional ferroelectric memory, and FIG. 26 is a sectional view corresponding to FIG. 25. Referring to FIGS. 25 and 26, element isolation regions 102 are formed on prescribed regions of the surface of a semiconductor substrate 101 in the structure of the conventional ferroelectric memory. Source regions 103 and drain regions 104 are formed in element forming regions enclosed with the element isolation regions 102. Gate electrodes 106 forming word lines WL are formed on channel regions located between the source regions 103 and the drain regions 104 through gate insulator films 105. Bit lines (BL) 113 are electrically connected to the drain regions 104.

Lower electrodes 109 are formed on the source regions 103 through plug electrodes 108. Upper electrodes 111 constituting plate lines PL are formed on the lower electrodes 109 through ferroelectric layers 110. The lower electrodes 109, the ferroelectric layers 110 and the upper electrodes 111 form ferroelectric capacitors 112. The source and drain regions 103 and 104, the gate insulator films 105 and the gate electrodes 106 form transistors 107. The transistors 107 serve as switches for selecting memory cells 100. As shown in FIG. 25, each memory cell 100 is formed by a single transistor 107 and a single ferroelectric capacitor 112.

However, the conventional ferroelectric memory shown in FIGS. 25 and 26 having the memory cells 100 each formed by the single transistor 107 and the single ferroelectric capacitor 112 disadvantageously requires a relatively large memory cell area.

In this regard, there has been developed a simple matrix ferroelectric memory having memory cells each formed by only a single ferroelectric capacitor.

FIG. 27 is a circuit diagram of a conventional simple matrix ferroelectric memory, and FIG. 28 is a sectional view corresponding to FIG. 27. Referring to FIGS. 27 and 28, a ferroelectric layer 202 is formed on bit lines (BL) 201 in the conventional simple matrix ferroelectric memory. Word lines (WL) 203 are formed on the ferroelectric layer 202 to intersect with the bit lines 201. The bit lines 201, the ferroelectric layer 202 and the word lines 203 form ferroelectric capacitors 210. In this simple matrix ferroelectric memory, each memory cell 200 is formed by only a single ferroelectric capacitor 210, as shown in FIG. 27.

FIG. 29 is a circuit diagram for illustrating a conventional ½Vcc method of applying voltages to the simple matrix ferroelectric memory in writing, and FIG. 30 is a circuit diagram for illustrating a conventional ⅓Vcc method of applying voltages to the simple matrix ferroelectric memory in writing.

Referring to FIG. 29, a power supply voltage Vcc is applied across a bit line $BL_1$ and a word line $WL_1$ connected with a selected memory cell (hereinafter also referred to as "selected cell") 200 in the conventional ½Vcc method, in order to drive the selected cell 200. In other words, the power supply voltage Vcc and a voltage of 0 V are applied to the word line $WL_1$ and the bit line $BL_1$ respectively. Further, the voltage of 0 V is applied to word lines $WL_0$ and $WL_2$ connected with non-selected memory cells (hereinafter also referred to as "non-selected cells") 200, and a voltage of ½Vcc is applied to bit lines $BL_0$ and $BL_2$ connected with the non-selected cells 200. Thus, the power supply voltage Vcc is applied to the selected cell 200 while the voltage ½Vcc is applied to the non-selected cells 200.

Referring to FIG. 30, a power supply voltage Vcc is applied to the word line $WL_1$ while a voltage of 0 V is applied to the bit line $BL_1$ in the conventional ⅓Vcc method. Further, a voltage of ⅓Vcc is applied to the word lines $WL_0$ and $WL_2$ connected with the non-selected memory cells (non-selected cells) 200, and a voltage of ⅔Vcc is applied to the bit lines $BL_0$ and $BL_2$ connected with the non-selected cells 200. Thus, the power supply voltage Vcc is applied to the selected cell 200 while the voltage ⅓Vcc is applied to the non-selected cells 200.

In each of the aforementioned cases, polarization inversion must be sufficiently saturated with respect to the ferroelectric layer 202 (see FIG. 28) of the selected cell 200 while polarized states must be substantially unchanged with respect to the ferroelectric layers 202 of the non-selected cells 200.

At present, however, the angular shape of ferroelectric hysteresis loop is so insufficient that information (quantity of charges) is lost by the so-called disturbance if the voltage of ½Vcc or ⅓Vcc is continuously unidirectionally applied to the non-selected cells 200, as shown in FIG. 31. Information written in the non-selected cells 200 is lost due to such disturbance, and hence the ferroelectric memory is hard to use in this case. At present, therefore, it is regarded as difficult to put the simple matrix ferroelectric memory shown in FIGS. 27 and 28 into practice.

Comparing the conventional ⅓Vcc method with the conventional ½Vcc method, potential difference applied to the non-selected cells 200 of the simple matrix ferroelectric memory can be suppressed to ⅓Vcc according to the conventional ⅓Vcc method. According to the ⅓Vcc method, therefore, reduction of the polarization quantity of the non-selected cells 200 can be more suppressed in the simple matrix ferroelectric memory as compared with the ½Vcc method.

In the conventional ⅓Vcc method, however, voltages of ⅓Vcc (=k) and ⅔Vcc (=2k) must be applied to the non-selected word lines $WL_0$ and $WL_2$ and the non-selected bit lines $BL_0$ and $BL_2$ respectively in order to set potential difference applied to the non-selected memory cells (non-selected cells) 200 to ⅓Vcc. In this case, four types of potentials Vcc (=3k), ⅔Vcc (=2k), ⅓Vcc (=1k) and 0 V must be selectively applied when writing data of "1" or "0" in the selected cell 200. Therefore, the simple matrix ferroelectric memory requires a power supply system generating the aforementioned four types of potentials. Further, the simple matrix ferroelectric memory also requires a system for selectively transmitting the four types of potentials generated by the power supply system to the bit lines $BL_0$ to $BL_2$ and the word lines $WL_0$ to $WL_2$. Therefore, the power supply system and the system selectively transmitting the potentials generated by the power supply system to the memory cells 200 are disadvantageously complicated. Consequently, it is disadvantageously difficult to save the area, increase the speed and reduce the power in the conventional simple matrix ferroelectric memory.

SUMMARY OF THE INVENTION

An object of the present invention is to provide a ferroelectric memory capable of improving disturbance resistance in a non-selected memory cell.

Another object of the present invention is put a simple matrix ferroelectric memory into practice by improving disturbance resistance in a non-selected memory cell.

Still another object of the present invention is to provide an operating method for a ferroelectric memory capable of improving disturbance resistance in a non-selected memory cell.

A further object of the present invention is to provide a memory device capable of saving the area, increasing the speed and reducing the power.

A further object of the present invention is to simplify a power supply system and a system of selectively transmitting a potential generated by the power supply system to a memory cell in the aforementioned memory device.

A further object of the present invention is to reduce the number of types of voltages applied to a bit line and a word line to three while ensuring disturbance resistance similar to that attained when employing a conventional $\frac{1}{3}$Vcc method in the aforementioned memory device.

In order to attain the aforementioned objects, a ferroelectric memory according to a first aspect of the present invention comprises a bit line, a word line arranged to intersect with the bit line and a memory cell, arranged between the bit line and the word line, including a ferroelectric capacitor and a diode serially connected to the ferroelectric capacitor.

The ferroelectric memory according to the first aspect is provided with the memory cell including the ferroelectric capacitor and the diode serially connected to the ferroelectric capacitor as hereinabove described, whereby the diode exhibits substantially infinite resistance in a voltage range hardly feeding a current to the diode, so that most part of a voltage is applied to the diode while substantially no voltage is applied to the ferroelectric capacitor. When a voltage in the range hardly feeding a current to the diode is applied to a non-selected cell in data writing or data reading, therefore, substantially no voltage is applied to the ferroelectric capacitor so that the non-selected cell can be prevented from disturbance in a simple matrix ferroelectric memory. Consequently, disturbance resistance of the non-selected cell can be improved in the simple matrix ferroelectric memory. Thus, the simple matrix ferroelectric memory can be put into practice.

In the aforementioned ferroelectric memory according to the first aspect, the diode is preferably formed by a diode satisfying $|Vt| \neq |Vb|$ assuming that Vt and Vb represent a turn-on voltage and a breakdown voltage of the diode respectively.

The aforementioned ferroelectric memory according to the first aspect preferably applies a voltage in a range hardly feeding a current to the diode to a non-selected memory cell at least either in data writing or in data reading. According to this structure, the non-selected cell can be easily prevented from disturbance.

In the aforementioned ferroelectric memory according to the first aspect, a standby voltage between the bit line and the word line is preferably in the range of $(Vt+Vb)<\text{standby voltage}<0$ assuming that Vt and Vb represent a turn-on voltage and a breakdown voltage of the diode respectively. According to this structure, the standby voltage approaches the center of hysteresis loop of the memory cell formed by the ferroelectric capacitor and the diode as compared with a standby voltage of 0 V, whereby resistance against noise can be improved when performing no writing or reading as compared with a case of setting the standby voltage to 0 V. In this case, the standby voltage is preferably set to $(Vt+Vb)/2$. According to this structure, resistance against noise can be further improved when performing no writing or reading.

The aforementioned ferroelectric memory according to the first aspect preferably applies asymmetrical voltage pulses to the bit line and the word line thereby performing at least either data writing or data reading. According to this structure, the ferroelectric memory according to the first aspect can easily write or read data.

The aforementioned ferroelectric memory according to the first aspect preferably further comprises pulse application means for applying a pulse having a prescribed pulse width causing polarization inversion when applying a voltage whose absolute value is high to the ferroelectric capacitor while causing substantially no polarization inversion when applying a voltage whose absolute value is low to the ferroelectric capacitor to the memory cell, for applying a pulse of a voltage having the prescribed pulse width whose absolute value is high to a selected memory cell while applying a pulse of a voltage having the prescribed pulse width whose absolute value is low to a non-selected memory cell at least either in data writing or in data reading. According to this structure, the ferroelectric memory can write or read data in or from the selected memory cell while hardly causing polarization inversion with respect to the non-selected memory cell. Consequently, disturbance resistance can be further improved in the non-selected memory cell. In this case, the pulse application means may include a pulse application circuit.

In the aforementioned ferroelectric memory according to the first aspect, the diode preferably includes a p-n junction diode formed by a junction of a p-type semiconductor layer and an n-type semiconductor layer. According to this structure, the diode can be so formed that the characteristics thereof are not deteriorated by annealing (heat treatment) for crystallizing the ferroelectric layer. In this case, the p-type semiconductor layer and the n-type semiconductor layer may include amorphous layers. According to this structure, a fine p-n junction diode can be homogeneously prepared.

In the aforementioned ferroelectric memory according the first aspect, the diode preferably includes a p-n junction diode formed by a junction of a p-type region and an n-type region formed on a semiconductor substrate. According to this structure, the cell size can be reduced while the diode can be so formed that the characteristics thereof are not deteriorated by annealing (heat treatment) for crystallizing the ferroelectric layer.

In the aforementioned ferroelectric memory according to the first aspect, the diode preferably includes a Schottky diode formed by a junction of a conductive layer and a semiconductor layer. According to this structure, the diode can be so formed that the characteristics thereof are not deteriorated by annealing (heat treatment) for crystallizing the ferroelectric layer.

In this case, the conductive layer forming the Schottky diode may contain a metal and silicon, and the metal may include at least one metal selected from a group consisting of Ir, Pt, Ru, Re, Ni, Co and Mo. Alternatively, the conductive layer forming the Schottky diode may contain a metal, nitrogen and silicon, and the metal may include at least one metal selected from a group consisting of Ir, Pt, Ru, Re, Ni, Co and Mo. According to this structure, a thermally stable Schottky barrier can be formed.

In the aforementioned ferroelectric memory including the Schottky diode formed by the junction of the conductive layer and the semiconductor layer, the semiconductor layer forming the Schottky diode may include an amorphous layer. According to this structure, a fine Schottky diode can be homogeneously prepared.

In the aforementioned ferroelectric memory according to the first aspect, the diode may includes a Schottky diode formed by a junction of a p-type region or an n-type region formed on a semiconductor substrate and a conductive layer formed on the p-type region or the n-type region. According to this structure, the cell size can be reduced while the diode can be so formed that the characteristics thereof are not deteriorated by annealing (heat treatment) for crystallizing the ferroelectric layer.

An operating method for a ferroelectric memory according to a second aspect of the present invention is an operating method for a ferroelectric memory comprising a bit line, a word line arranged to intersect with the bit line and a memory cell, arranged between the bit line and the word line, including a ferroelectric capacitor and a diode serially connected to the ferroelectric capacitor, which applies asymmetrical voltage pulses to the bit line and the word line thereby writing or reading binary data.

The operating method for a ferroelectric memory according to the second aspect applies asymmetrical voltage pulses to the bit line and the word line thereby writing or reading binary data in the ferroelectric memory comprising the memory cell including the ferroelectric capacitor and the diode serially connected to the ferroelectric capacitor as hereinabove described, whereby the diode exhibits substantially infinite resistance in a voltage range hardly feeding a current to the diode, so that most part of a voltage is applied to the diode while substantially no voltage is applied to the ferroelectric capacitor. When a voltage in the range hardly feeding a current to the diode is applied to a non-selected cell in data writing or data reading, therefore, substantially no voltage is applied to the ferroelectric capacitor so that the non-selected cell can be prevented from disturbance in a simple matrix ferroelectric memory.

In the aforementioned operating method for a ferroelectric memory according to the second aspect, a standby voltage between the bit line and the word line is preferably in the range of $(V_t+V_b)<$standby voltage$<0$ assuming that $V_t$ and $V_b$ represent a turn-on voltage and a breakdown voltage of the diode respectively. According to this structure, the standby voltage approaches the center of hysteresis loop of the memory cell formed by the ferroelectric capacitor and the diode as compared with a standby voltage of 0 V, whereby resistance against noise can be improved when performing no writing or reading as compared with a case of setting the standby voltage to 0 V. In this case, the standby voltage is preferably set to $(V_t+V_b)/2$. According to this structure, resistance against noise can be further improved when performing no writing or reading.

In the aforementioned operating method for a ferroelectric memory according to the second aspect, the ferroelectric memory preferably further comprises pulse application means for applying a pulse having a prescribed pulse width causing polarization inversion when applying a voltage whose absolute value is high to the ferroelectric capacitor while causing substantially no polarization inversion when applying a voltage whose absolute value is low to the ferroelectric capacitor to the memory cell, for applying a pulse of a voltage having the prescribed pulse width whose absolute value is high to a selected memory cell while applying a pulse of a voltage having the prescribed pulse width whose absolute value is low to a non-selected memory cell at least either in data writing or in data reading. According to this structure, data can be written in or read from the selected memory cell while hardly causing polarization inversion with respect to the non-selected memory cell. Consequently, disturbance resistance can be further improved in the non-selected memory cell.

A memory device according to a third aspect of the present invention comprises a bit line, a word line arranged to intersect with the bit line and a memory cell, connected to the bit line and the word line, including storage means having hysteresis. The center of hysteresis of the memory cell including the storage means deviates from 0 V by a prescribed potential so that at least three types of voltages are applied to the bit line and the word line.

In the memory device according to the third embodiment, the center of hysteresis loop of the memory cell including the storage means deviates from 0 V by the prescribed potential so that at least three types of voltages are applied to the bit line and the word line as hereinabove described, whereby three types of voltages can be employed when writing or reading two data in or from one memory cell so that a power supply system and a system selectively transmitting potentials generated by the power supply system to the memory cell can be more simplified as compared with the conventional ⅓Vcc method requiring four types of voltages. Consequently, the memory device can save the area, increase the speed and reduce the power. When the memory device is employed as a multivalued memory writing or reading at least three data in or from a single memory cell, the number of types of voltages exceeds three. Also in this case, the number of types of voltages can be reduced as compared with the ⅓Vcc method.

In the aforementioned memory device according to the third aspect, the storage means preferably stores two types of data, and the center of the hysteresis loop of the memory cell including the storage means preferably deviates from 0 V by the prescribed potential so that only three types of voltages are applied to the bit line and the word line. According to this structure, the power supply system and the system selectively transmitting the potentials generated by the power supply system to the memory cell can be easily simplified in the memory device storing two types of data as compared with the conventional ⅓Vcc method requiring four types of voltages.

The aforementioned memory device according to the third aspect preferably applies positive and negative reverse voltages having substantially identical absolute values from the center of the hysteresis loop deviating from 0 V by the prescribed potential to a non-selected memory cell. According to this structure, disturbance resistance can be ensured similarly to the case employing the conventional ⅓Vcc method.

In the aforementioned memory device according to the third aspect, the storage means preferably includes a ferroelectric film, and the memory cell including the ferroelectric film is preferably arranged between the bit line and the word line. According to this structure, a simple matrix ferroelectric memory capable of saving the area, increasing the speed and reducing the power can be easily obtained.

In the aforementioned memory device according to the third aspect, the storage means preferably includes a ferroelectric film, and the memory cell including the ferroelectric film is preferably provided on a gate portion of a field-effect transistor. According to this structure, an FET-type ferroelectric memory capable of saving the area, increasing the speed and reducing the power can be easily obtained.

In the aforementioned memory device according to the third aspect, the memory cell preferably includes a diode serially connected to the storage means having hysteresis. According to this structure, the center of the hysteresis loop of the memory cell including the storage means can easily deviate by the prescribed potential.

The aforementioned memory device including the diode serially connected to the storage means having hysteresis preferably applies a voltage smaller than the absolute value of a breakdown voltage of the diode to a non-selected memory cell in data writing and data reading. According to this structure, disturbance can be easily suppressed in the non-selected memory cell.

In the aforementioned memory device according to the third aspect, the center of the hysteresis loop preferably so deviates from 0 V that the absolute value of potential difference applied to a selected memory cell when writing first data and the absolute value of potential difference applied to the selected memory cell when writing second data are in the ratio of about 1:2. According to this structure, three types of voltages can be easily applied to the bit line and the word line when storing two types of data.

In the aforementioned memory device according to the third aspect, the storage means preferably includes a ferroelectric film having hysteresis loop whose center deviates from 0 V by a prescribed potential so that at least three types of voltages are applied to the bit line and the word line. When such a ferroelectric film is employed, no diode is required and hence the memory cell structure can be further simplified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
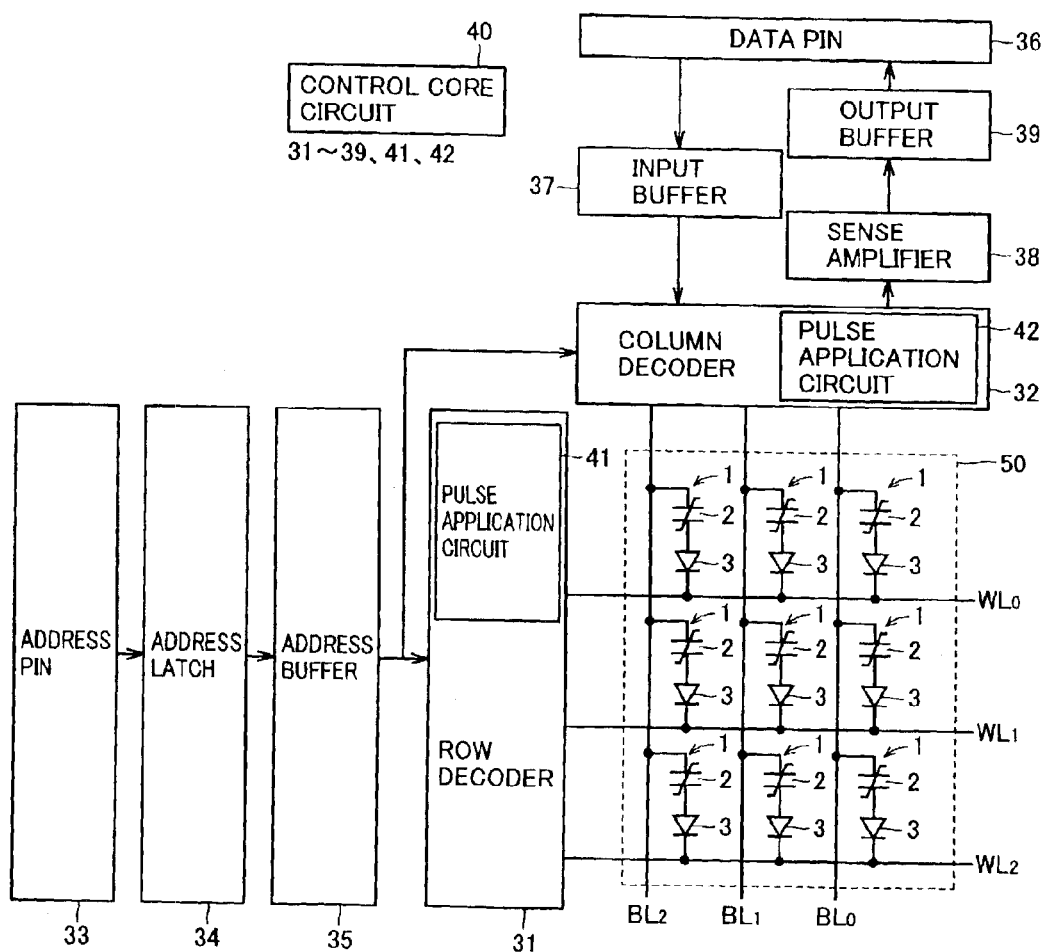
FIG. 1 is a circuit diagram showing the overall structure of a ferroelectric memory according to a first embodiment of the present invention.

The overall structure of a simple matrix ferroelectric memory according to a first embodiment of the present invention is described with reference to FIGS. 1 and 2. In the ferroelectric memory according to the first embodiment, a memory cell array 50 is formed by arranging a plurality of memory cells 1 in the form of a matrix (FIG. 1 shows only nine memory cells 1 for convenience of illustration). First terminals of ferroelectric capacitors 2 forming the memory cells 1 are connected to bit lines $BL_0$ to $BL_2$, and second terminals of the ferroelectric capacitors 2 are connected to first terminals of diodes 3. Second terminals of the diodes 3 are connected to word lines $WL_0$ to $WL_2$. According to the first embodiment, each memory cell 1 is formed by the ferroelectric capacitor 2 and the diode 3 serially connected to the ferroelectric capacitor 2. The diode 3 is described later in detail.

The word lines $WL_0$ to $WL_2$ are connected to a row decoder 31. The bit lines $BL_0$ to $BL_2$ are connected to a column decoder 32.

Externally specified row and column addresses are input in an address pin 33. The row and column addresses are transferred from the address pin 33 to an address latch 34. In the row and column addresses latched in the address latch 34, the row address is transferred to the row decoder 31 through an address buffer 35, and the column address is transferred to the column decoder 32 through the address buffer 35.

The row decoder 31 selects a word line corresponding to the row address latched in the address latch 34 from the word lines $WL_0$ to $WL_2$, and controls the potentials of the word lines $WL_0$ to $WL_2$ in response to an operating mode.

The column decoder 32 selects a bit line corresponding to the column address latched in the address latch 34 from the bit lines $BL_0$ to $BL_2$, and controls the potentials of the bit lines $BL_0$ to $BL_2$ in response to the operating mode.

The row decoder 31 and the column decoder 32 include pulse application circuits 41 and 42 for applying voltage pulses to the word lines $WL_0$ to $WL_2$ and the bit lines $BL_0$ to $BL_2$ respectively.

Externally specified data is input in a data pin 36. This data is transferred from the data pin 36 to the column decoder 32 through an input buffer 37. The column decoder 32 controls the potentials of the bit lines $BL_0$ to $BL_2$ to a level corresponding to the data.

Data read from an arbitrary memory cell 1 is transferred from any of the bit lines $BL_0$ to $BL_2$ to a sense amplifier 38 through the column decoder 32. The sense amplifier 38 is a voltage sense amplifier. The data determined by the sense amplifier 38 is output from an output buffer 39 through the data pin 36.

A control core circuit 40 controls operations of the aforementioned circuits 31 to 39, 41 and 42.

Figure 2:
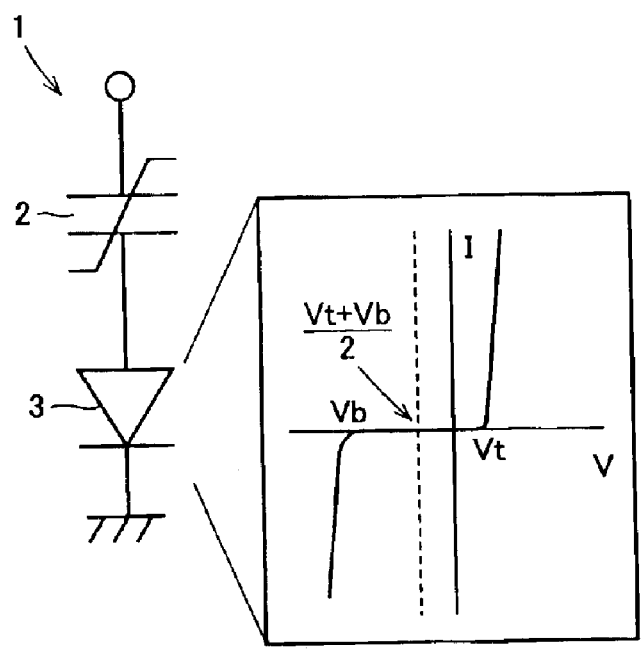
FIG. 2 is a schematic diagram for illustrating the structure of a memory cell of the ferroelectric memory according to the first embodiment shown in FIG. 1.
Figure 3:
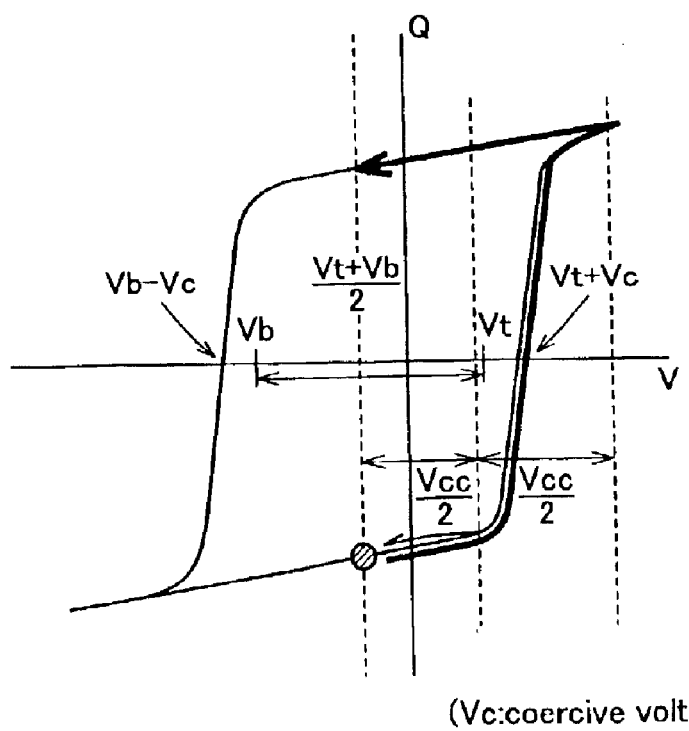
FIG. 3 is a diagram for illustrating an effect of the ferroelectric memory according to the first embodiment of the present invention.

As shown in FIG. 2, the diode 3 forming each memory cell 1 in the first embodiment has a positive turn-on voltage Vt starting to forwardly feed a current and a negative breakdown voltage Vb having a larger absolute value than the turn-on voltage Vt and causing reverse breakdown. FIG. 3 shows a quantity Q of charges with respect to an applied voltage V across the memory cell 1. In this case, most of the applied voltage V in the range of $Vb \leq V \leq Vt$ with respect to a voltage (Vt+Vb)/2 is applied to the diode 3. In other words, the voltage V in the aforementioned range hardly feeds a current to the diode 3, which in turn exhibits substantially infinite resistance. Therefore, most of the voltage V is applied to the diode 3 and substantially no voltage is applied to the ferroelectric capacitor 2.

Referring to FIG. 3, a power supply voltage Vcc is so set as to satisfy $(Vt-Vb)/2 \geq ½Vcc$ and cause sufficient polarization inversion at (Vt+Vb)/2+Vcc assuming that a standby voltage is expressed as (Vt+Vb)/2. In this case, the formula $(Vt-Vb)/2 \geq ½Vcc$ denotes the condition for the power supply voltage Vcc hardly feeding a current to the diode 3 when a voltage of (Vt+Vb)/2±½Vcc is applied to the memory cell 1.

Figure 4:
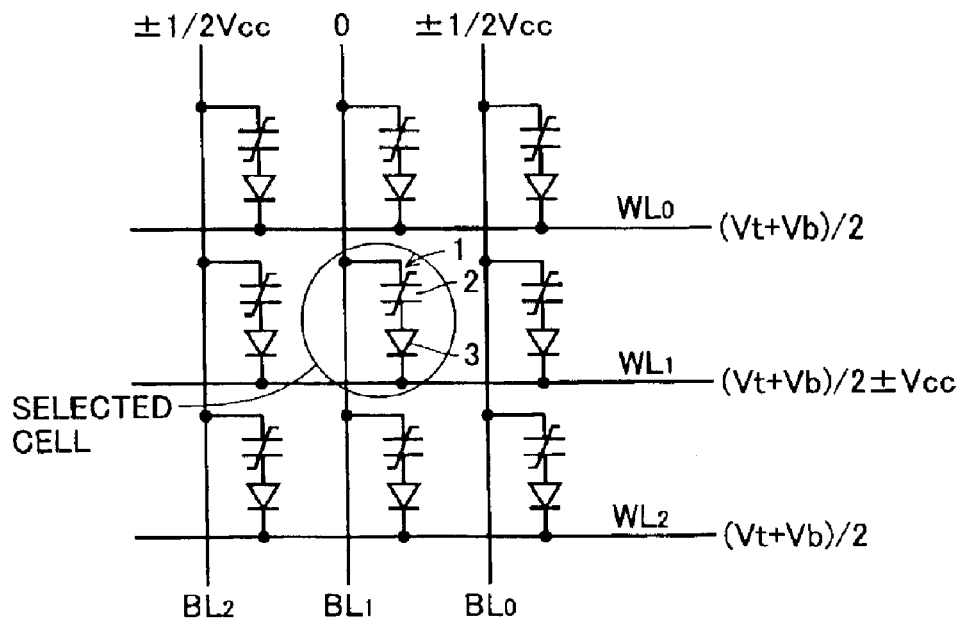
FIG. 4 is a circuit diagram for illustrating a voltage application system in the ferroelectric memory according to the first embodiment of the present invention.

FIG. 4 is a circuit diagram for illustrating a voltage application system in the ferroelectric memory according to the first embodiment of the present invention. Referring to FIG. 4, the ferroelectric memory according to the first embodiment applies a voltage pulse of (Vt+Vb)/2+Vcc or (Vt+Vb)/2−Vcc to a selected cell 1 while applying a voltage pulse of (Vt+Vb)/2±½Vcc to non-selected cells 1. The voltage pulses (Vt+Vb)/2+Vcc and (Vt+Vb)/2−Vcc are asymmetrical with respect to 0 V. The voltage pulses (Vt+Vb)/2+½Vcc and (Vt+Vb)/2−½Vcc are also asymmetrical with respect to 0 V. When applying such asymmetrical voltage pulses, the ferroelectric memory can write or read data in or from the selected cell 1 by polarization inversion while hardly applying a voltage to the ferroelectric capacitors 2 of the non-selected cells 1. Thus, the ferroelectric memory can prevent the non-selected cells 1 from disturbance.

Further, the ferroelectric memory according to the first embodiment sets the standby voltage applied to the cells 1 in a standby state to (Vt+Vb)/2 while applying a voltage obtained by adding ±Vcc to the standby voltage to the selected cell 1 and applying a voltage obtained by adding ±½Vcc to the standby voltage to the non-selected cells 1. Also when the standby voltage causes fluctuation up to (Vt−Vb)/2 when the ferroelectric memory performs no reading or writing, therefore, substantially no current flows to the diodes 3 and hence substantially no voltage is applied to the ferroelectric capacitors 2. Consequently, noise resistance can be improved as compared with a case of setting the standby voltage to 0 V.

According to the first embodiment, as hereinabove described, each memory cell 1 includes the ferroelectric capacitor 2 and the diode 3 serially connected to the ferroelectric capacitor 2 so that the diode 3 exhibits substantially infinite resistance in a voltage range hardly feeding a current to the diode 3, whereby most of the voltage is applied to the diode 3 and substantially no voltage is applied to the ferroelectric capacitor 2. When applying the aforementioned voltage in the range hardly feeding a current to the diode 3 to the non-selected cells 1 in data writing or data reading, therefore, substantially no voltage is applied to the ferroelectric capacitors 2 and hence the simple matrix ferroelectric memory can prevent the non-selected cells 1 from disturbance. Consequently, the simple matrix ferroelectric memory can be put into practice.

Figure 5:
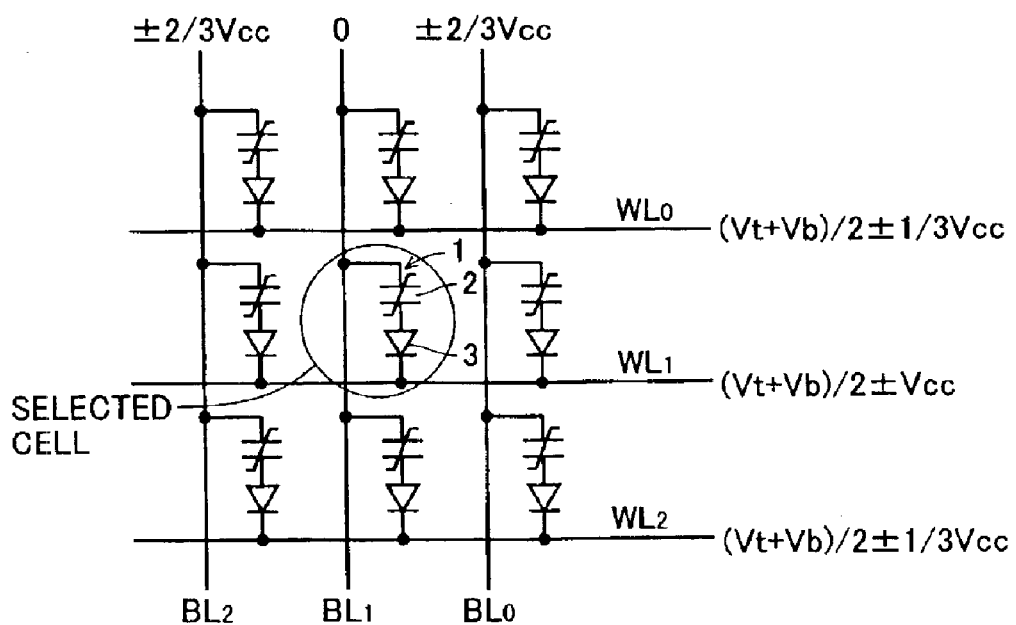
FIG. 5 is a circuit diagram for illustrating a voltage application system in a ferroelectric memory according to a modification of the first embodiment of the present invention.

FIG. 5 is a circuit diagram for illustrating a voltage application system in a ferroelectric memory according to a modification of the first embodiment of the present invention. Referring to FIG. 5, the ferroelectric memory according to the modification of the first embodiment sets a power supply voltage Vcc as to satisfy $(Vt-Vb)/2 \geq \frac{1}{3}Vcc$ and cause sufficient polarization inversion at $(Vt+Vb)/2+Vcc$ assuming that a standby voltage is expressed as $(Vt+Vb)/2$. In this case, the formula $(Vt-Vb)/2 \geq \frac{1}{3}Vcc$ denotes the condition for the power supply voltage Vcc hardly feeding a current to a diode 3 when a voltage of $(Vt+Vb)/2 \pm \frac{1}{3}Vcc$ is applied to a memory cell 1.

As shown in FIG. 5, the ferroelectric memory according to the modification of the first embodiment applies a voltage pulse of $(Vt+Vb)/2+Vcc$ or $(Vt+Vb)/2-Vcc$ to a selected cell 1 while applying a voltage pulse of $(Vt+Vb)/2 \pm \frac{1}{3}Vcc$ to non-selected cells 1. The voltage pulses $(Vt+Vb)/2+Vcc$ and $(Vt+Vb)/2-Vcc$ applied to the selected cell 1 are asymmetrical with respect to 0 V. The voltage pulses $(Vt+Vb)/2+\frac{1}{3}Vcc$ and $(Vt+Vb)/2-\frac{1}{3}Vcc$ applied to the non-selected cells 1 are also asymmetrical with respect to 0 V. When applying such asymmetrical voltage pulses, the ferroelectric memory can write or read data in or from the selected cell 1 by polarization inversion while hardly applying a voltage to ferroelectric capacitors 2 of the non-selected cells 1. Thus, the ferroelectric memory can prevent the non-selected cells 1 from disturbance.

The ferroelectric memory according to the modification of the first embodiment may set the standby voltage to $(Vt+Vb)/2$ in a standby state while applying a voltage obtained by adding $\pm Vcc$ to the standby voltage to the selected cell 1 and applying a voltage obtained by adding $\pm \frac{1}{3}Vcc$ to the standby voltage to the non-selected cells 1, similarly to the first embodiment.

(Second Embodiment)

A second embodiment of the present invention is now described with reference to an operating method inhibiting non-selected cells from disturbance also when applying a voltage feeding a current to diodes 3 to the non-selected cells.

According to the aforementioned first embodiment, the ferroelectric memory applies the voltage V satisfying $Vb \leq V \leq Vt$ with respect to the standby voltage $(Vt+Vb)/2$ thereby feeding substantially no current to the diodes 3 of the non-selected cells 1 and applying most of the applied voltage to the diodes 3. On the other hand, the operating method according to the second embodiment inhibits disturbance also when setting a power supply voltage Vcc to satisfy $(Vt-Vb)/2<\frac{1}{2}Vcc$ and sufficiently cause polarization inversion at $(Vt+Vb)/2+Vcc$. In this case, the formula $(Vt-Vb)/2<\frac{1}{2}Vcc$ denotes a condition for the power supply voltage Vcc for feeding a current to diodes 3 when applying a voltage of $(Vt+Vb)/2 \pm \frac{1}{2}Vcc$ to memory cells 1.

With the power supply voltage Vcc set in the aforementioned manner according to the second embodiment, a ferroelectric memory applies voltage pulses of $(Vt+Vb)/2 \pm Vcc$ and $(Vt+Vb)/2 \pm \frac{1}{2}Vcc$ to a selected cell 1 and non-selected cells 1 respectively, as shown in FIG. 4. In this case, the ferroelectric memory applies a voltage of $(Vb-Vt)/2+Vcc$ or $(Vt-Vb)/2-Vcc$ to a ferroelectric capacitor 2 of the selected cell 1. In the non-selected cells 1, a current flows to the diodes 3 dissimilarly to the first embodiment, and hence the ferroelectric memory applies a voltage of $(Vb-Vt)/2+\frac{1}{2}Vcc$ or $(Vt-Vb)/2-\frac{1}{2}Vcc$ to the ferroelectric capacitors 2 of the non-selected cells 1.

Figure 6:
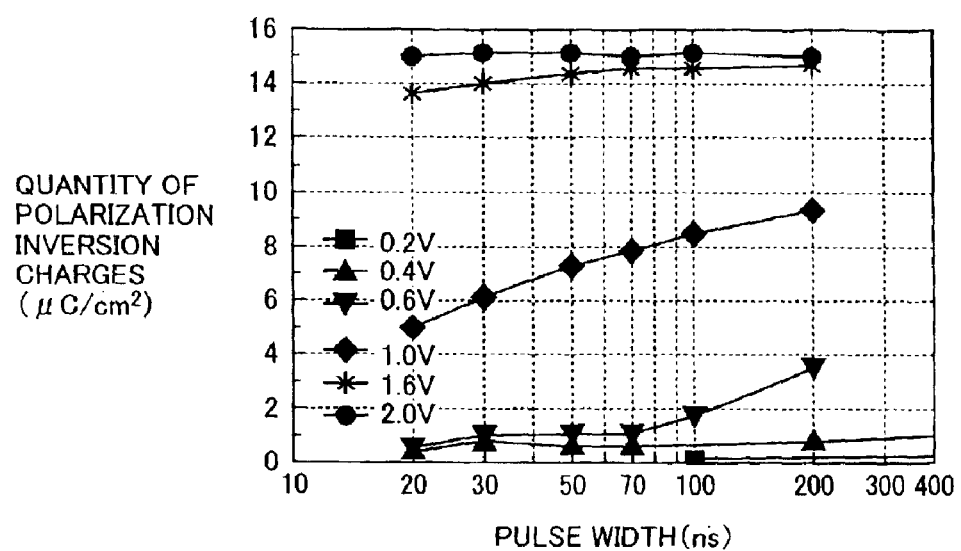
FIG. 6 illustrates pulse response characteristics of a ferroelectric layer in relation to the quantity of polarization inversion.

FIG. 6 shows the relation between the widths of pulses applied to ferroelectric capacitors employing $SrBi_2Ta_2O_9$ (SBT) films as ferroelectric layers and quantities of polarization inversion charges. As clearly understood from FIG. 6, the quantity of polarization inversion charges is substantially saturated to exhibit 14 $\mu C/cm^2$ to 15 $\mu C/cm^2$ when the pulse width is not more than 70 nsec. and a high voltage of at least 1.6 V, for example, is applied. It is also understood that polarization inversion is hardly caused when the pulse width is not more than 70 sec. and a low voltage of not more than 0.6 V, for example, is applied. Thus, it is understood that the ferroelectric layer causes polarization inversion when the pulse width is relatively small and a high voltage is applied, while the same hardly causes polarization inversion when a low voltage is applied.

According to the second embodiment, the ferroelectric memory applies a pulse having a width causing sufficient polarization inversion when applying a voltage of about $(Vb-Vt)/2+Vcc$ or $(Vt-Vb)/2-Vcc$, whose absolute value is high, to the ferroelectric capacitors 2 of the memory cells 1 while hardly causing polarization inversion when applying a voltage of about $(Vb-Vt)/2+\frac{1}{2}Vcc$ or $(Vt-Vb)/2-\frac{1}{2}Vcc$, whose absolute value is low, thereto. Thus, the ferroelectric memory can inhibit the non-selected cells 1 from disturbance also when applying a voltage feeding a current to the diodes 3 to the non-selected cells 1.

The ferroelectric memory may apply the aforementioned pulse with pulse application circuits 41 and 42 similar to those shown in FIG. 1. In this case, the pulse application circuits 41 and 42 are examples of the "pulse application means" in the present invention.

With the aforementioned power supply voltage Vcc employed in the second embodiment, the ferroelectric memory may apply voltages of $(Vt+Vb)/2 \pm Vcc$ and $(Vt+Vb)/2 \pm \frac{1}{3}Vcc$ to the selected cell 1 and the non-selected cells 1 respectively as a modification of the second embodiment, as shown in FIG. 5. In this case, the ferroelectric memory applies a voltage of $(Vb-Vt)/2+Vcc$ or $(Vt-Vb)/2-Vcc$ to the ferroelectric capacitor 2 of the selected cell 1. Further, the ferroelectric memory applies a voltage of $(Vb-Vt)/2+\frac{1}{3}Vcc$ or $(Vt-Vb)/2-\frac{1}{3}Vcc$ to the ferroelectric capacitors 2 of the non-selected memory cells 1. Also in the modification of the second embodiment, the ferroelectric memory applies a pulse having a width causing sufficient polarization inversion when applying a voltage of about $(Vb-Vt)/2+Vcc$ or $(Vt-Vb)/2-Vcc$, whose absolute value is high, to the ferroelectric capacitors 2 of the memory cells 1 while hardly causing polarization inversion when applying a voltage of about $(Vb-Vt)/2+\frac{1}{3}Vcc$ or $(Vb-Vt)/2-\frac{1}{3}Vcc$, whose absolute value is low, thereto. Thus, the ferroelectric memory can inhibit the non-selected cells 1 from disturbance also when applying a voltage feeding a current to the diodes 3 to the non-selected cells 1.

(Third Embodiment)

Figure 7:
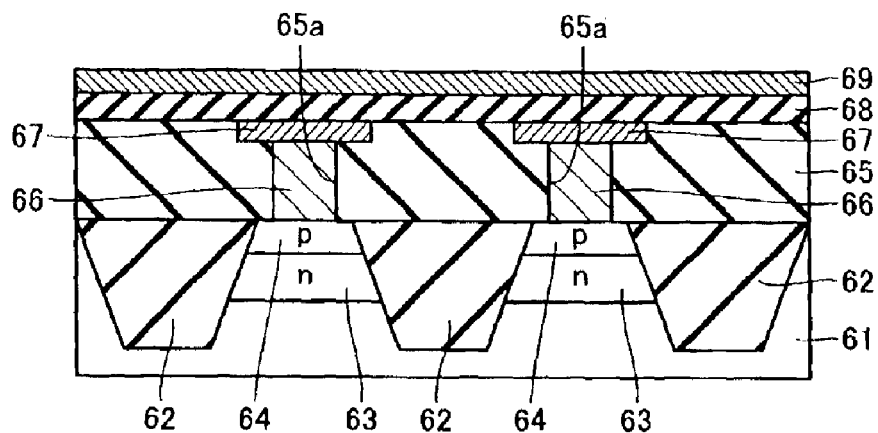
FIG. 7 is a sectional view showing the structure of a memory cell of a ferroelectric memory according to a third embodiment of the present invention.
Figure 8:
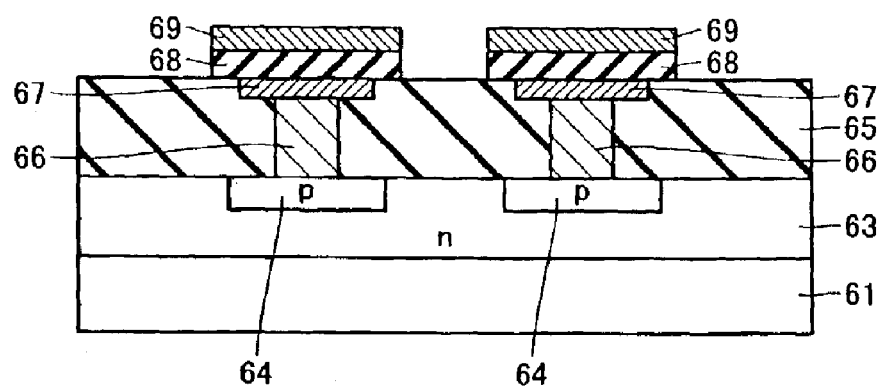
FIG. 8 is a sectional view of the memory cell according to the third embodiment shown in FIG. 7 as viewed from a direction rotated by 90°.

Referring to FIGS. 7 and 8, a ferroelectric memory according to a third embodiment of the present invention employs p-n junction diodes formed on a silicon substrate 61 as diodes 3 connected to ferroelectric capacitors 2 forming memory cells 1 (see FIG. 1). More specifically, element isolation films 62 are formed on prescribed regions of the surface of the silicon substrate 61 by STI (shallow trench isolation). N-type regions 63 are formed on surface portions of the silicon substrate 61 located between the element isolation films 62. P-type regions 64 are formed in the n-type regions 63. The p-type regions 64 and the n-type regions 63 form the p-n junction diodes in the ferroelectric memory according to the third embodiment.

An interlayer dielectric film 65 is formed to cover the overall surface. Plug electrodes 66 are formed in contact holes 65a of the interlayer dielectric film 65 to be electrically connected to the p-type regions 64. Lower electrodes 67 are formed on the plug electrodes 66. Upper electrodes 69 are formed on the lower electrodes 67 through ferroelectric layers 68 consisting of SBT or the like. The lower electrodes 67, the ferroelectric layers 68 and the upper electrodes 69 form ferroelectric capacitors in the ferroelectric memory according to the third embodiment.

According to the third embodiment, the cell size can be reduced by forming the p-n junction diodes on the silicon substrate 61 as hereinabove described, and the characteristics of the diodes are not deteriorated by annealing (heat treatment) performed under a temperature of at least 600° C. for crystallizing the ferroelectric layers 68.

Figure 9:
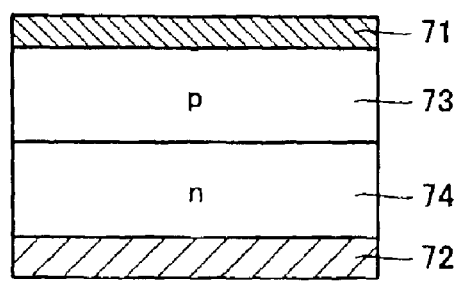
FIG. 9 is a sectional view showing the structure of a diode part of a memory cell according to a modification of the third embodiment shown in FIGS. 7 and 8.

FIG. 9 is a sectional view showing the structure of a diode part of each memory cell of a ferroelectric memory according to a modification of the third embodiment shown in FIGS. 7 and 8. According to the modification of the third embodiment, two electrodes 71 and 72 and p- and n-type semiconductor thin films 73 and 74 arranged between the electrodes 71 and 72 form a p-n junction diode, as shown in FIG. 9. In this case, each of the p- and n-type semiconductor thin films 73 and 74 is formed by an amorphous or polycrystalline semiconductor layer. In particular, the amorphous semiconductor layer having no grain boundary can homogenize the diode characteristics also when preparing a fine structure. The amorphous semiconductor layer can be made of amorphous silicon, for example.

(Fourth Embodiment)

Figure 10:
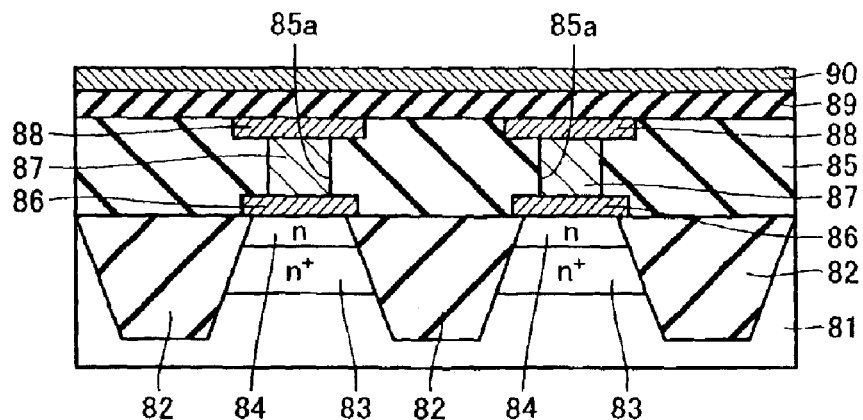
FIG. 10 is a sectional view showing the structure of a memory cell of a ferroelectric memory according to a fourth embodiment of the present invention.
Figure 11:
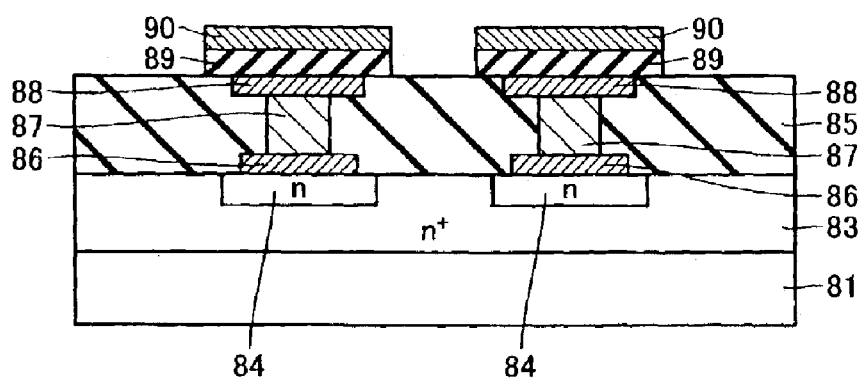
FIG. 11 is a sectional view of the memory cell according to the fourth embodiment shown in FIG. 10 as viewed from a direction rotated by 90°.

Referring to FIGS. 10 and 11, a ferroelectric memory according to a fourth embodiment of the present invention employs Schottky diodes formed on a silicon substrate 81 as diodes 3 connected to ferroelectric capacitors 2 forming memory cells 1 (see FIG. 1). More specifically, element isolation films 82 are formed on prescribed regions of the silicon substrate 81 by STI, as shown in FIG. 10. N$^+$-type regions 83 are formed on surface portions of the silicon substrate 81 located between the element isolation films 82. N-type regions 84 are formed in the n$^+$-type regions 83. Conductive layers 86 are formed on the n-type regions 84. Schottky barriers are formed on the interfaces between the n-type regions 84 and the conductive layers 86. Thus, the n-type regions 84 and the conductive layers 86 form Schottky diodes in the ferroelectric memory according to the fourth embodiment. The n$^+$- and n-type regions 83 and 84 shown in FIGS. 10 and 11 may alternatively be replaced with p$^+$- and p-type type regions respectively for forming the Schottky diodes.

An interlayer dielectric film 85 is formed to cover the conductive layers 86 and the element isolation films 82. Plug electrodes 87 are formed in contact holes 85a of the interlayer dielectric film 85 to be connected to the conductive layers 86. Lower electrodes 88 are formed on the plug electrodes 87. Upper electrodes 90 are formed on the lower electrodes 88 through ferroelectric layers 89 consisting of SBT or the like. The lower electrodes 88, the ferroelectric layers 89 and the upper electrodes 90 form the ferroelectric capacitors in the ferroelectric memory according to the fourth embodiment.

According to the fourth embodiment, the cell size can be reduced by forming the Schottky diodes on the silicon substrate 81 as shown in FIGS. 10 and 11.

Figure 12:
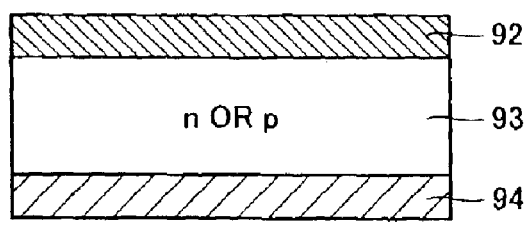
FIG. 12 is a sectional view showing the structure of a diode part of a memory cell according to a modification of the fourth embodiment shown in FIGS. 10 and 11.

FIG. 12 is a sectional view showing a diode part of each memory cell in a ferroelectric memory according to a modification of the fourth embodiment shown in FIGS. 10 and 11. According to the modification of the fourth embodiment, a Schottky diode is formed through a junction of an n- or p-type semiconductor layer 93 and a conductive layer 92, as shown in FIG. 12. An electrode 94 is formed on a surface of the n- or p-type semiconductor layer 93 opposite to the conductive layer 92. In this case, the n- or p-type semiconductor layer 93 is formed by a polycrystalline or amorphous semiconductor layer. In particular, the amorphous semiconductor layer having no grain boundary can homogenize the diode characteristics also when preparing a fine structure. The amorphous semiconductor layer is made of amorphous silicon or the like.

Figure 13:
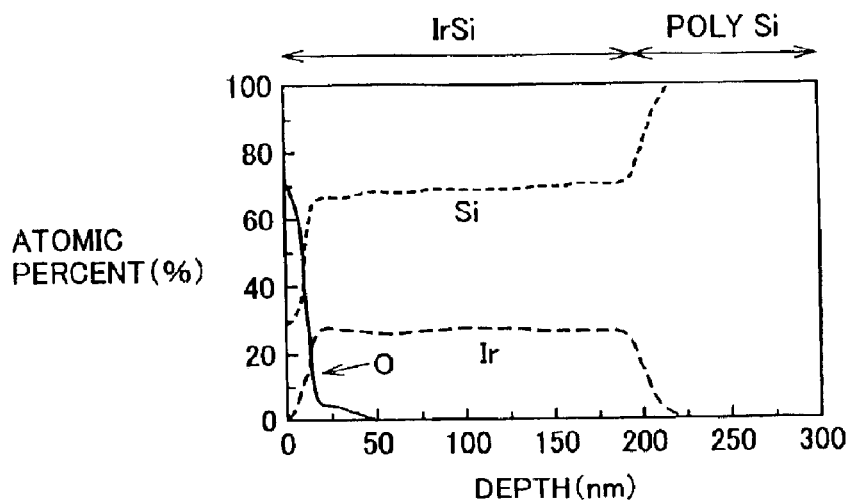
FIGS. 13 and 14 are correlation diagrams for illustrating thermal stability of a Schottky diode according to a fourth embodiment of the present invention.
Figure 14:
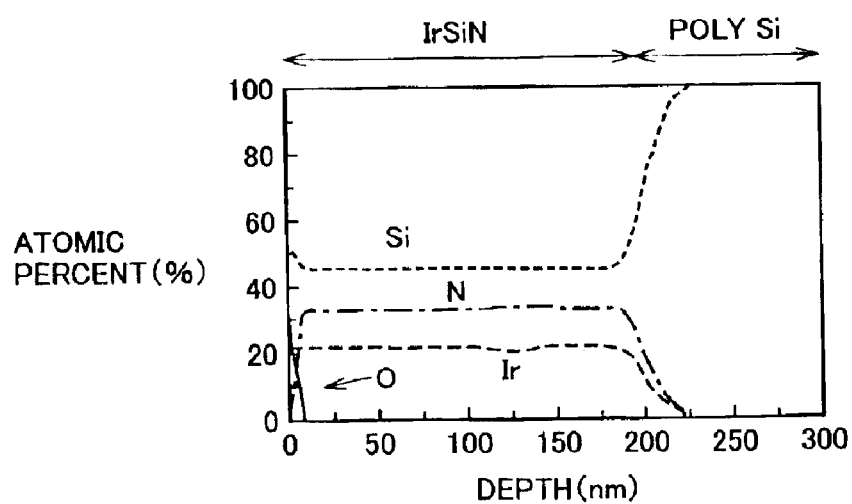

The Schottky diode requires thermal stability, not to exhibit an ohmic property by interdiffusion on the interface between the conductive layer and the semiconductor layer in a step of fabricating a semiconductor device. FIGS. 13 and 14 show depth profiles of compositions of IrSi/polysilicon and IrSiN/polysilicon samples subjected to heat treatment of 800° C. respectively.

As clearly understood from FIGS. 13 and 14, no remarkable interdiffusion is observed on the IrSi/polysilicon and IrSiN/polysilicon interfaces after high-temperature treatment at the temperature of 800° C. but the junctions between conductive layers of IrSi and IrSiN and semiconductor layers of polysilicon are thermally stable. Such a thermally stable junction can also be obtained by a conductive material containing at least one of Ir, Pt, Ru, Re, Ni, Co and Mo and silicon or a conductive material containing at least one of Ir, Pt, Ru, Re, Ni, Co and Mo, silicon and nitrogen.

[Fifth to Seventh Embodiments]

Fifth to seventh embodiments of the present invention and the concept of the present invention corresponding to the fifth to seventh embodiments are now described with reference to FIGS. 15 to 24.

The concept of the present invention corresponding to the fifth to seventh embodiments is now described with reference to FIGS. 15 and 16.

Figure 15:
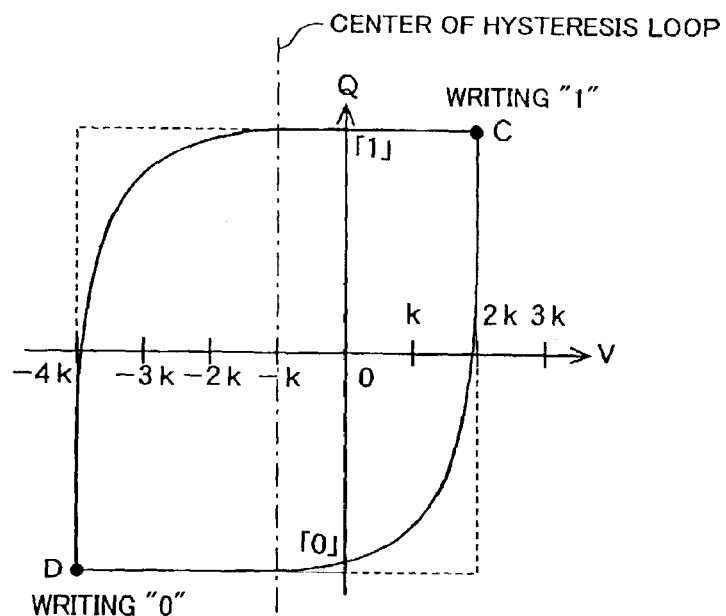
FIG. 15 is a characteristic diagram showing hysteresis loop of a memory cell according to the present invention.

According to the present invention, the center of the hysteresis loop of each memory cell 1a (see FIG. 16) deviates from the intersection (origin: 0 V) between the axis Q of ordinates and the axis V of abscissas by k in a negative potential direction, as shown in FIG. 15. In this case, potential difference 2k is necessary for writing data "1" in a selected cell 1a, and potential difference −4k is necessary for writing data "0". In other words, the center of the hysteresis loop of the memory cell 1a so deviates that the ratio between the absolute value of potential difference applied to the selected cell 1a when writing the data "1" and that of potential difference applied to the selected cell 1a when writing the data "0" is 1:2. As shown in FIG. 16, therefore, three types of voltages, i.e., 0 V, 2k and 4k are applied to bit lines BL1 to BL3 and word lines WL1 to WL3. Assuming that the value k is equal to ⅓Vcc, three types of voltages, i.e., 0 V, ⅔Vcc and ⅓Vcc are applied to the bit lines BL1 to BL3 and the word lines WL1 to WL3.

Figure 16:
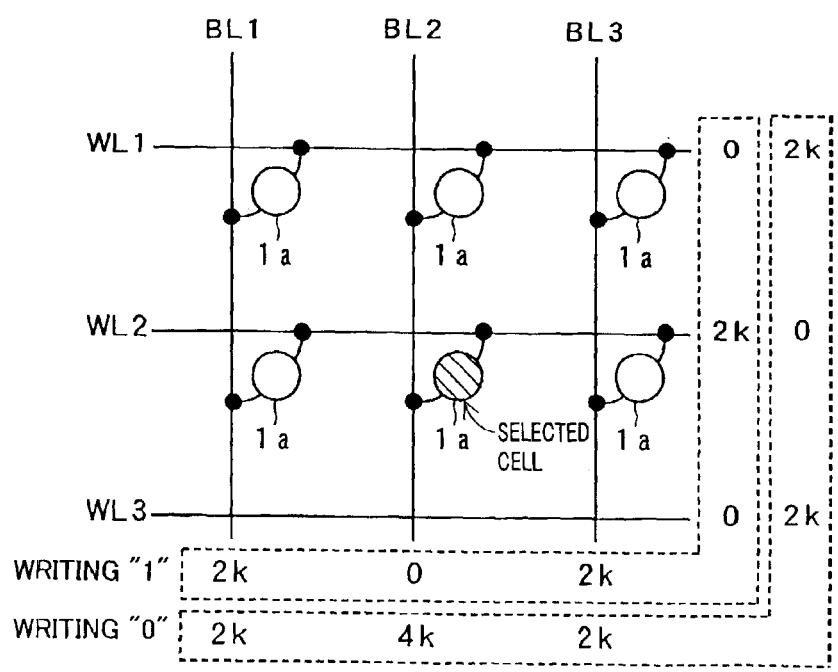
FIG. 16 is a circuit diagram for illustrating a voltage application system in a simple matrix ferroelectric memory prepared with the memory cell shown in FIG. 15.

According to the present invention, memory cells 1a having the aforementioned hysteresis characteristics are employed for forming a simple matrix ferroelectric memory shown in FIG. 16. More specifically, the memory cells 1a are arranged in the form of a matrix on the intersections between the bit lines BL1 to BL3 and the word line WL1 to WL3 arranged perpendicularly to each other. The simple matrix ferroelectric memory is provided with a power supply system (not shown) for applying prescribed potential difference to the memory cells 1a through the word lines WL1 to WL3 and the bit lies BL1 to BL3 and a system (not shown) selectively transmitting potentials generated by the power supply system to the memory cells 1a.

A write operation of the aforementioned simple matrix ferroelectric memory according to the present invention is now described on the assumption that the value k is equal to ⅓Vcc.

In a standby state, both ends of each memory cell 1a are at the same potential. When writing the data "1" in the selected cell 1a, the simple matrix ferroelectric memory applies the voltage 0 V to the bit line BL2 while applying the voltage 2k (=⅔Vcc) to the word line WL2, as shown in FIGS. 15 and 16. The simple matrix ferroelectric memory further applies the voltage 2k (=⅔Vcc) to the bit lines BL1 and BL3 while applying the voltage 0 V to the word lines WL1 and WL3. In this case, the simple matrix ferroelectric memory applies the voltage 2k (=⅔Vcc) to the selected cell 1a. Thus, the polarization state of the selected cell 1a makes a transition to a point C shown in FIG. 15. The simple matrix ferroelectric memory thereafter sets both ends of each memory cell 1a to the same potential again, so that the polarization state of the selected cell 1a makes a transition to "1" shown in FIG. 15. Thus, the simple matrix ferroelectric memory writes the data "1" in the selected cell 1a.

In order to write the data "0" in the selected cell 1a, the simple matrix ferroelectric memory applies the voltage 4k (=⁴⁄₃Vcc) to the bit line BL2 while applying the voltage 0 V to the word line WL2, as shown in FIGS. 15 and 16. The simple matrix ferroelectric memory further applies the voltage 2k (=⅔Vcc) to the bit lines BL1 and BL2 as well as to the word lines WL1 and WL3. In this case, the simple matrix ferroelectric memory applies the voltage −4k (=−⁴⁄₃Vcc) to the selected cell 1a. Thus, the polarization state of the selected cell 1a makes a transition to a point D shown in FIG. 15. The simple matrix ferroelectric memory thereafter sets both ends of each memory cell 1a to the same potential again, so that the polarization state of the selected cell 1a makes a transition to "0" shown in FIG. 15. Thus, the simple matrix ferroelectric memory writes the data "0" in the selected cell 1a.

As hereinabove described, the simple matrix ferroelectric memory according to the present invention displaces the center of the hysteresis loop of each memory cell 1a by k for applying only three types of voltages to the bit lines BL1 to BL3 and the word lines WL1 to WL3 so that the power supply system and the system selectively transmitting the potentials generated by the power supply system to the memory cells 1a can be simplified as compared with the conventional ⅓Vcc method requiring four types of voltages. Consequently, the memory device can save the area, increase the speed and reduce the power. The simple matrix ferroelectric memory according to the inventive concept shown in FIGS. 15 and 16 can write arbitrary data in the selected cell 1a by selectively applying three types of potentials 4k (=⁴⁄₃Vcc), 2k (=⅔Vcc) and 0 V to the bit lines BL1 to BL3 and the word lines WL1 to WL3.

According to the present invention, the simple matrix ferroelectric memory applies the voltage 0 V or −2k (=−⅔Vcc) to the non-selected cells 1a when writing the data "1" while applying the voltage −2k (=−⅔Vcc) or 0 V to the non-selected cells 1a when writing the data "0" as shown in FIG. 16, whereby the potential difference applied to the non-selected cells 1a is 0 V or −2k, corresponding to ⅓Vcc (=k) or −⅓Vcc (=−k) applied to the non-selected cells in the conventional ⅓Vcc method in the point of "deviation from the center of the hysteresis loop". Thus, the simple matrix ferroelectric memory can ensure disturbance resistance similarly to that in the case of employing the conventional ⅓Vcc method. Consequently, the number of the types of voltages applied to the bit lines BL1 to BL3 and the word lines WL1 to WL3 can be reduced to three while ensuring disturbance resistance similar to that in the case of employing the conventional ⅓Vcc method.

The fifth to seventh embodiments embodying the aforementioned concept of the present invention are now described.

(Fifth Embodiment)

Figure 17:
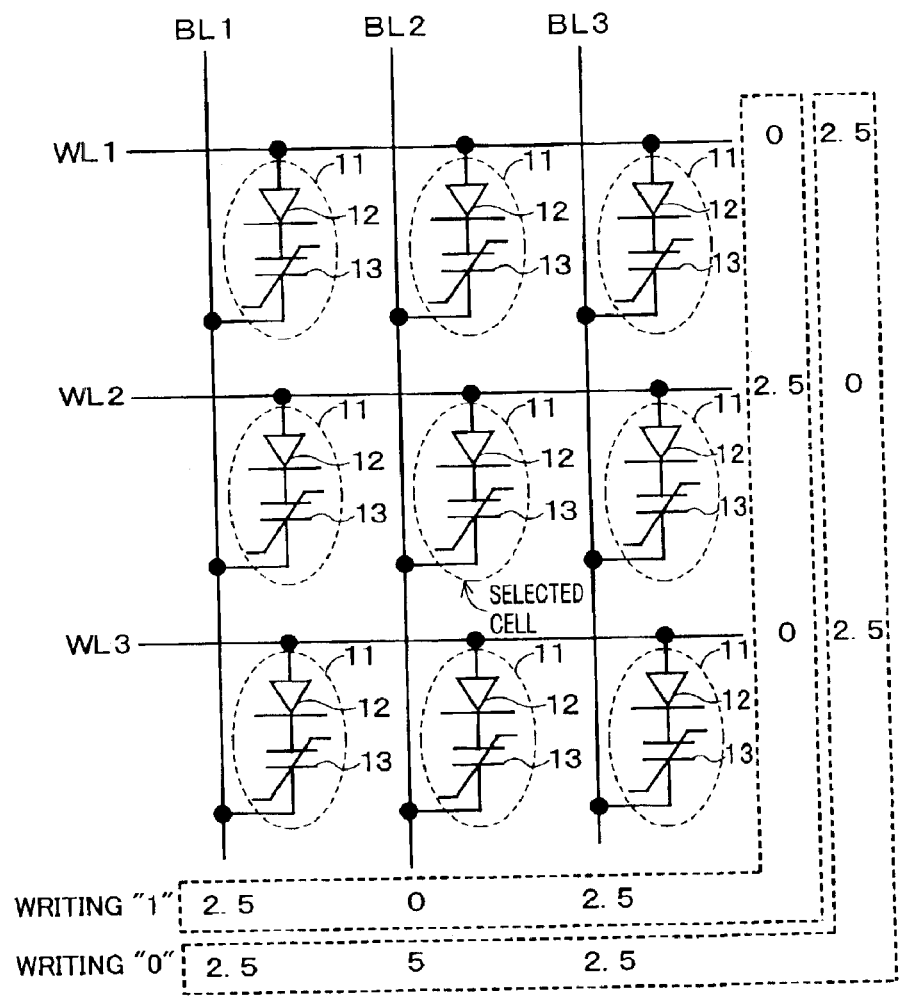
FIG. 17 is a circuit diagram for illustrating a voltage application system in a simple matrix ferroelectric memory according to a fifth embodiment of the present invention.

The structure of a simple matrix ferroelectric memory according to the fifth embodiment of the present invention is described with reference to FIG. 17. According to the fifth embodiment, memory cells 11 are formed by Zener diodes 12 and ferroelectric capacitors 13, as shown in FIG. 17. First ends of the Zener diodes 12 and the ferroelectric capacitors 13 are connected to word lines WL1 to WL3 and bit lines BL1 to BL3 respectively. The simple matrix ferroelectric memory is further provided with a power supply system (not shown) for applying prescribed potential difference to the memory cells 11 through the word lines WL1 to WL3 and the bit lines BL1 to BL3 and a system (not shown) selectively transmitting potentials generated by the power supply system to the memory cells 11. The Zener diodes 12 are examples of the "diode" in the present invention, and the ferroelectric capacitors 13 are examples of the "storage means" in the present invention.

Figure 18:
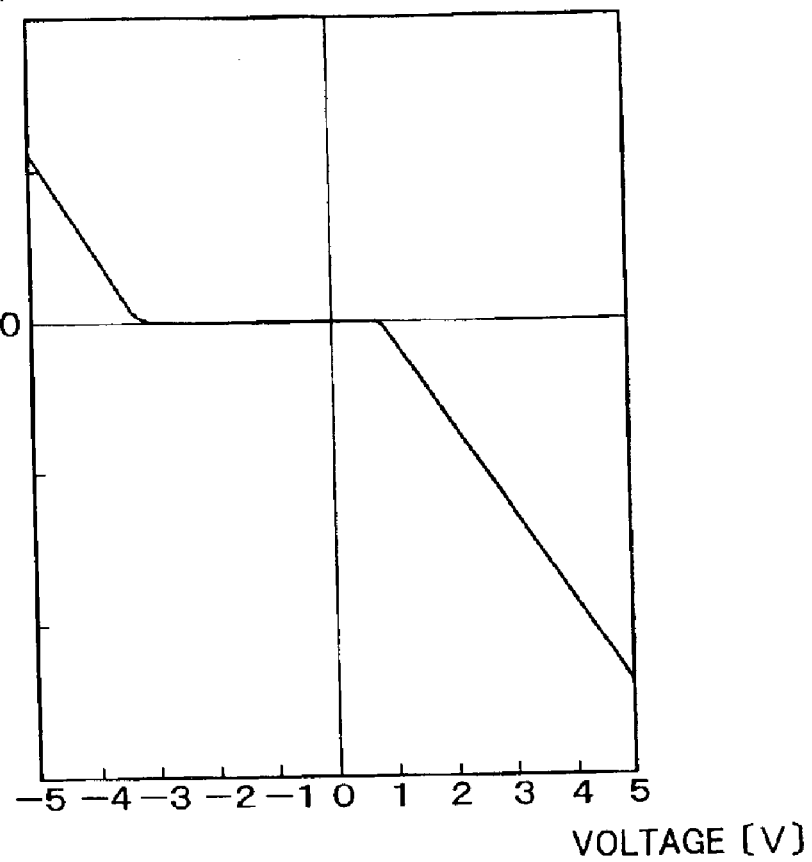
FIG. 18 is a characteristic diagram showing a simulated waveform of I–V (current-voltage) static characteristics of a Zener diode forming a memory cell of the simple matrix ferroelectric memory shown in FIG. 17.
Figure 19:
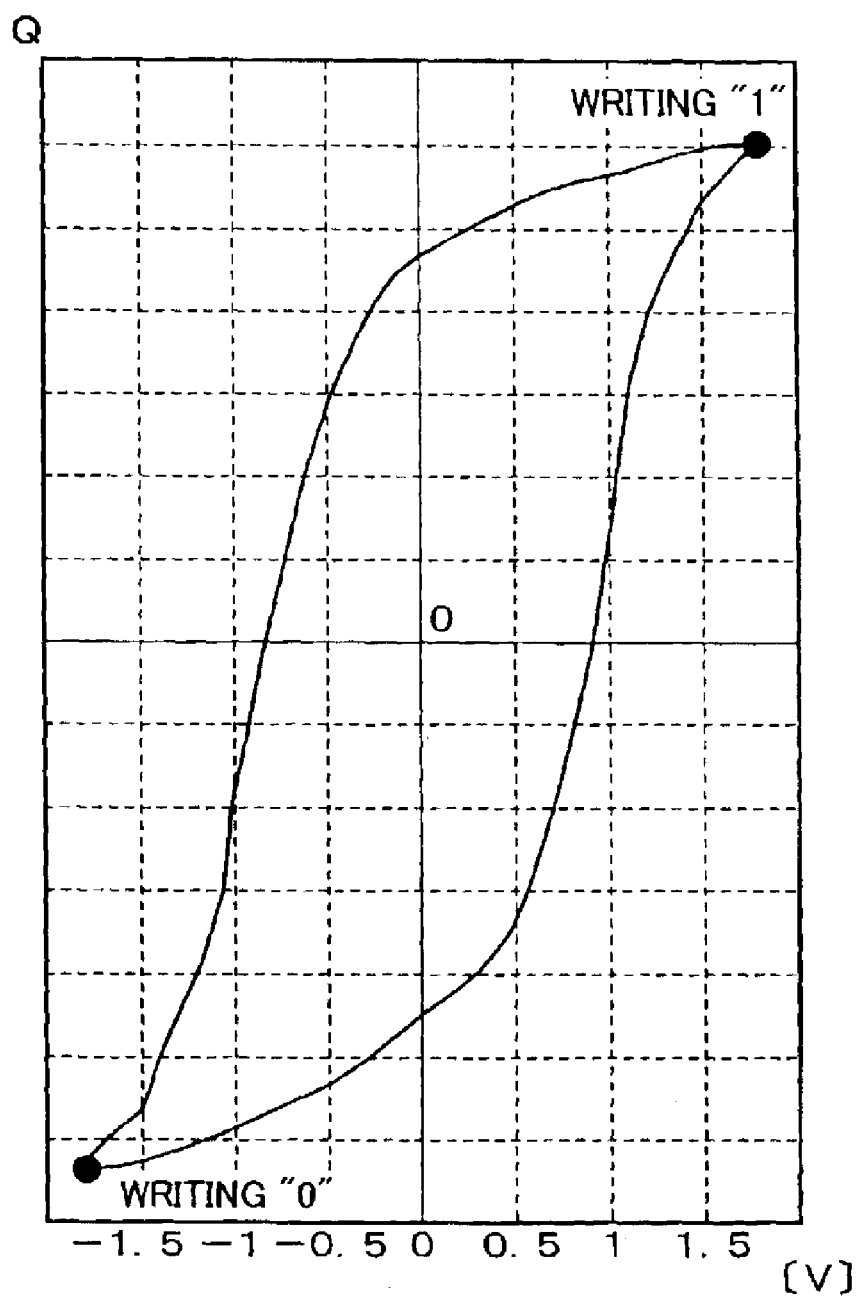
FIG. 19 is a characteristic diagram showing a simulated waveform of hysteresis loop of a ferroelectric capacitor forming the memory cell of the simple matrix ferroelectric memory shown in FIG. 17.
Figure 20:
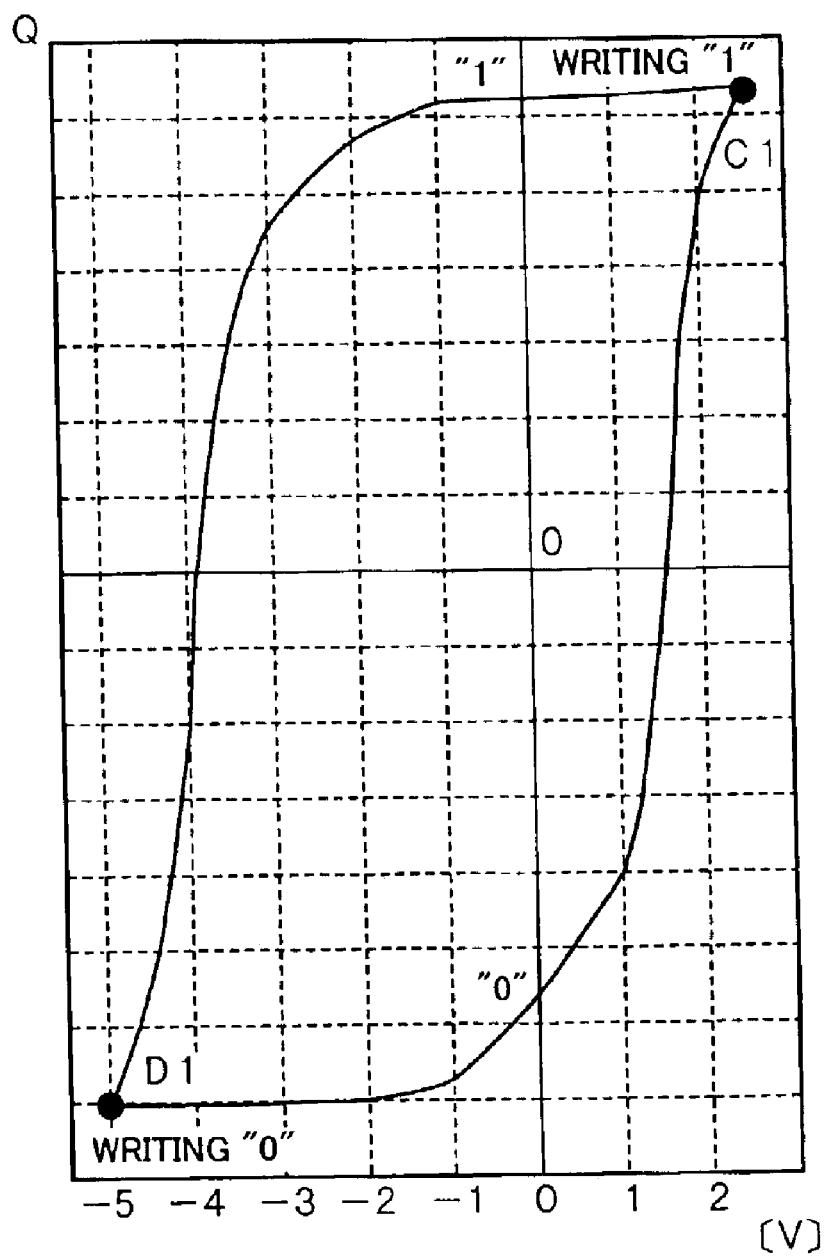
FIG. 20 is a characteristic diagram showing a simulated waveform of hysteresis loop of a memory cell of the simple matrix ferroelectric memory shown in FIG. 17.

According to the fifth embodiment, the center of the hysteresis loop of each memory cell 11 deviates in a negative potential direction due to rectification characteristics of the Zener diode 12 serially connected to the ferroelectric capacitor 13. As to the rectification characteristics of the Zener diode 12 forming each memory cell 11, a forward turn-on voltage is 0.7 V and a reverse breakdown voltage is −3.2 V, as shown in FIG. 18. The ferroelectric capacitor 13 forming each memory cell 11 has substantially point-symmetrical hysteresis loop with respect to the origin Q-V, i.e., centered at the origin ((Q,V)=(0,0)), as shown in FIG. 19. That is, center of point-symmetrical hysteresis loop is the center of hysteresis loop. When the Zener diode 12 and the ferroelectric capacitor 13 are serially connected with each other, the center of the hysteresis loop of the memory cell 11 can deviate due to the rectification characteristics of the Zener diode 12, as shown in FIG. 20. Thus, the memory cell 11 can be obtained with the hysteresis requiring potential difference of 2.5 V for writing data "1" and requiring potential difference of −5 V for writing data "0". Thus, the simple matrix ferroelectric memory applies three types of voltages, i.e., 0 V, 2.5 V and 5 V to the bit lines BL1 to BL3 and the word lines WL1 to WL3.

A write operation of the aforementioned simple matrix ferroelectric memory according to the fifth embodiment is now described.

In a standby state, both ends of each memory cell 11 are at the same potential. When writing the data "1" in the selected cell 11, the simple matrix ferroelectric memory applies the voltage 0 V to the bit line BL2 while applying the voltage 2.5 V to the word line WL2, as shown in FIG. 17. The simple matrix ferroelectric memory further applies the voltage 2.5 V to the bit lines BL1 and BL3 while applying the voltage 0 V to the word lines WL1 and WL3. In this case, the simple matrix ferroelectric memory applies the voltage 2.5 V to the selected cell 11. Thus, the polarization state of the selected cell 11 makes a transition to a point C1 shown in FIG. 20. The simple matrix ferroelectric memory thereafter sets both ends of each memory cell 11 to the same potential again, so that the polarization state of the selected cell 11 makes a transition to "1" shown in FIG. 20. Thus, the simple matrix ferroelectric memory writes the data "1" in the selected cell 11.

In order to write the data "0" in the selected cell 11, the simple matrix ferroelectric memory applies the voltage 5 V to the bit line BL2 while applying the voltage 0 V to the word line WL2, as shown in FIG. 17. The simple matrix ferroelectric memory further applies the voltage 2.5 V to the bit lines BL1 and BL3 as well as to the word lines WL1 and WL3. In this case, the simple matrix ferroelectric memory applies the voltage −5 V to the selected cell 11. Thus, the polarization state of the selected cell 11 makes a transition to a point D1 shown in FIG. 20. The simple matrix ferroelectric memory thereafter sets both ends of each memory cell 11 to the same potential again, so that the polarization state of the selected cell 11 makes a transition to "0" in FIG. 20. Thus, the simple matrix ferroelectric memory writes the data "0" in the selected cell 11.

As hereinabove described, the simple matrix ferroelectric memory according to the fifth embodiment displaces the center of the hysteresis loop of each memory cell 11 with the Zener diode 12 for applying only three types of voltages 0 V, 2.5 V and 5 V to the bit lines BL1 to BL3 and the word lines WL1 to WL3 so that the power supply system and the system selectively transmitting the potentials generated by the power supply system to the memory cells 11 can be simplified as compared with the conventional ⅓Vcc method requiring four types of voltages. Consequently, the memory device can save the area, increase the speed and reduce the power.

In a read operation, the simple matrix ferroelectric memory precharges a selected bit line to 0 V and thereafter brings the same into a floating state. Then, the simple matrix ferroelectric memory detects the potential of the selected bit line while applying the voltage 2.5 V to a selected word line thereby determining whether the data is "0" or "1".

(Sixth Embodiment)

While the simple matrix ferroelectric memory according to the fifth embodiment shown in FIG. 17 sets the voltages applied to the bit lines BL1 to BL3 and the word lines WL1 to WL3 to 0 V, 2.5 V and 5 V thereby applying the voltage 0 V or 2.5 V to the non-selected cells 11, a simple matrix ferroelectric memory according to the sixth embodiment applies other voltages to bit lines BL1 to BL3 and word lines WL1 to WL3 so that a voltage applied to non-selected cells 11 is lower than the absolute value (3.2 V) of a reverse breakdown voltage of Zener diodes 12. The sixth embodiment is now described in detail.

For example, it is assumed that the simple matrix ferroelectric memory applies voltages 0 V, Vcc1 and Vcc2 to the bit lines BL1 to BL3 and the word lines WL1 to WL3 while Va', Vb' and Vc' represent the absolute values of a forward turn-on voltage of the Zener diode 12 forming a selected cell 11, a reverse breakdown voltage thereof and a voltage applied to a ferroelectric capacitor 13 of the selected cell 11 respectively. It is also assumed that the absolute value Vc' remains identical when the simple matrix ferroelectric memory writes data "1" and "0". As hereinabove described, the voltages 2.5 V and 5 V applied to the bit lines BL1 to BL3 and the word lines WL1 to WL3 according to the fifth embodiment shown in FIG. 17 are replaced with the voltages Vcc1 and Vcc2 respectively in the sixth embodiment.

In other words, the simple matrix ferroelectric memory according to the sixth embodiment applies the voltage 0 V to the bit line BL2 while applying the voltage Vcc1 to the word line WL2 when writing the data "1" in the selected cell 11. The simple matrix ferroelectric memory further applies the voltage Vcc1 to the bit lines BL1 and BL3 connected to non-selected cells 11 while applying the voltage 0 V to the word lines WL1 and WL3. The following equation (1) expresses the voltage Vcc1 applied to the selected cell 11 for writing the data "1" therein, while the simple matrix ferroelectric memory applies the voltage 0 V or −Vcc1 to the non-selected cells 11:

$$Vcc1 = Va' + Vc' \quad (1)$$

In order to write the data "0" in the selected cell 11, the simple matrix ferroelectric memory applies the voltage Vcc2 to the bit line BL2 while applying the voltage 0 V to the word line WL2. The simple matrix ferroelectric memory further applies the voltage Vcc1 to the bit lines BL1 and BL3 connected to the non-selected cells 11 as well as to the word lines WL1 and WL3. The following equation (2) expresses the voltage Vcc2 applied to the selected cell 11 for writing the data "0" therein, while the simple matrix ferroelectric memory applies the voltage 0 V, −Vcc1 or −(Vcc2−Vcc1) to the non-selected cells 11 when writing the data "0":

$$Vcc2 = Vb' + Vc' \quad (2)$$

The following equations (3) to (5) express voltages $Vd_1$, $Vd_2$ and $Vd_3$ applied to the non-selected cells 11 for writing the data "0" or "1" as hereinabove described:

$$Vd_1 = 0 \text{ V} \quad (2)$$

$$Vd_2 = -Vcc1 \quad (4)$$

$$Vd_3 = -(Vcc2 - Vcc1) \quad (5)$$

Subtracting the above equation (1) from the equation (2), the following equation (6) expresses the absolute value (Vcc2−Vcc1) of the voltage $Vd_3$, expressed in the equation (5), applied to the non-selected cells 11:

$$Vcc2 - Vcc1 = Vb' - Va' \quad (6)$$

Referring to the above equation (6), the forward turn-on voltage Va' is greater than zero, whereby the following relation is obtained:

$$Vb' - Va' < Vb'$$

Hence, the absolute value (Vcc2−Vcc1) of the voltage $Vd_3$ applied to the non-selected cells 11 is lower than the reverse breakdown voltage Vb' of the Zener diode 12.

The simple matrix ferroelectric memory sets the applied voltages so that the absolute value Vcc1 of the voltage $Vd_2$ applied to the non-selected cells 11 expressed in the above equation (4) satisfies the following equation (7):

$$Vcc1 < Vb' \quad (7)$$

Thus, all voltages $Vd_1$, $Vd_2$ and $Vd_3$ applied to the non-selected cells 11 are lower than the reverse breakdown voltage Vb of the Zener diodes 12 forming the non-selected cells 11, whereby the Zener diodes 12 of the non-selected cells 11 are cut off. Thus, the non-selected cells 11 can be inhibited from disturbance.

The condition for the voltage Vc' applied to ferroelectric capacitors 13 forming the non-selected cells 11 can be obtained by substituting the above equation (1) in the above equation (7), as expressed in the following formula (8):

$$Vc' < Vb' - Va' \qquad (8)$$

The aforementioned simple matrix ferroelectric memory according to the fifth embodiment sets the absolute values of the voltages Va' and Vb' to 0.7 V and 3.2 V respectively while setting the voltage Vcc1 to ½Vcc2 so that the voltages Vcc1, Vcc2 and Vc' are equal to 2.5 V, 5 V and 1.8 V respectively from the above equation (6). In this case, the voltage Vcc1 may be less than the absolute value Vb' of 3.2 V in order to cut off the Zener diodes 12 of the non-selected cells 11, and the absolute value Vc' may be less than 2.5 V from the above equation (1) assuming that the absolute value Va' is equal to 0.7 V. According to the sixth embodiment, therefore, the voltages Vcc2 and Vc' are equal to 5.2 V and 2.0 V respectively when employing Zener diodes having characteristics of the voltages Va' and Vb' having absolute values equal to 0.7 V and 3.2 V respectively assuming that the voltage Vcc1 is equal to 2.7 V. In this case, the simple matrix ferroelectric memory applies three types of voltages 0 V, −2.5 V and −2.7 V to the non-selected cells 11 from the above equations (3) to (5), thereby cutting off the Zener diodes 12 of the non-selected cells 11. In a read operation, the simple matrix ferroelectric memory may change the voltage applied to the selected word line WL2 similarly to data reading in the fifth embodiment from 2.5 V to the voltage Vcc1.

As described above, the simple matrix ferroelectric memory applies the same voltage Vc' to the ferroelectric capacitor 13 of the selected cell 11 when writing the data "1" and "0". This is desirable for improving the symmetry of polarization hysteresis of each ferroelectric capacitor 13. However, the simple matrix ferroelectric memory may alternatively apply different voltages in a range not remarkably damaging the symmetry of the hysteresis so far as the voltages (Vcc2−Vcc1) and Vcc1 are less than the absolute value of the breakdown voltage Vb'. Assuming that the simple matrix ferroelectric memory applies a voltage having an absolute value of 2.1 V to a ferroelectric capacitor of a selected memory cell including a Zener diode having a turn-on voltage Va' and a breakdown voltage Vb' equal to 0.7 V and 3.2 V respectively for writing data "1" while applying a voltage having an absolute value of 2.2 V to the ferroelectric capacitor of the selected cell for writing data "0", for example, the voltages Vcc1 and Vcc2 are equal to 2.8 V and 5.4 V respectively. Also in this case, the simple matrix ferroelectric memory applies three types of voltages 0 V, −2.6 V and −2.8 V to non-selected cells, thereby cutting off Zener diodes of the non-selected cells.

(Seventh Embodiment)

Figure 21:
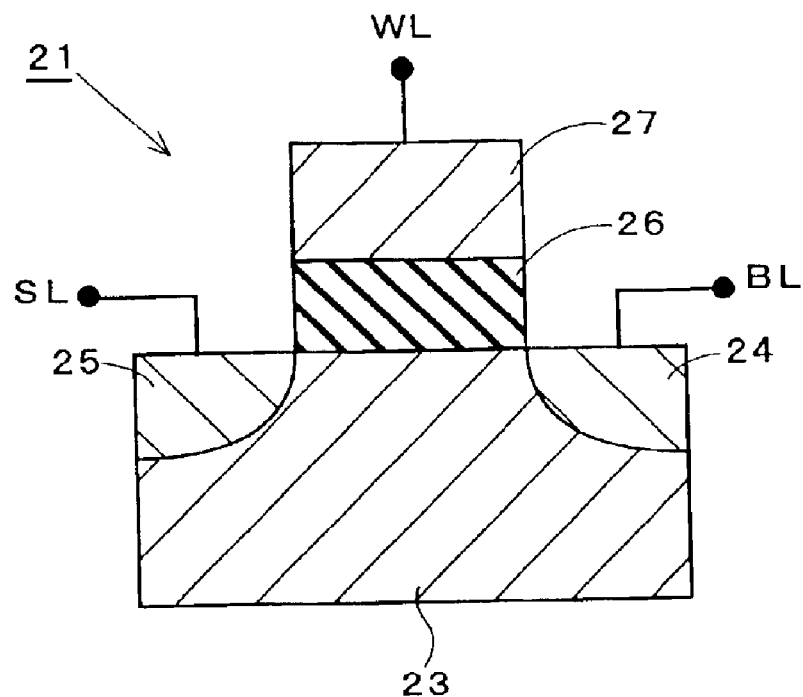
FIG. 21 is a sectional view showing the structure of a memory cell of an MFSFET (metal ferroelectric semiconductor field-effect transistor) type ferroelectric memory employed in a seventh embodiment of the present invention.
Figure 22:
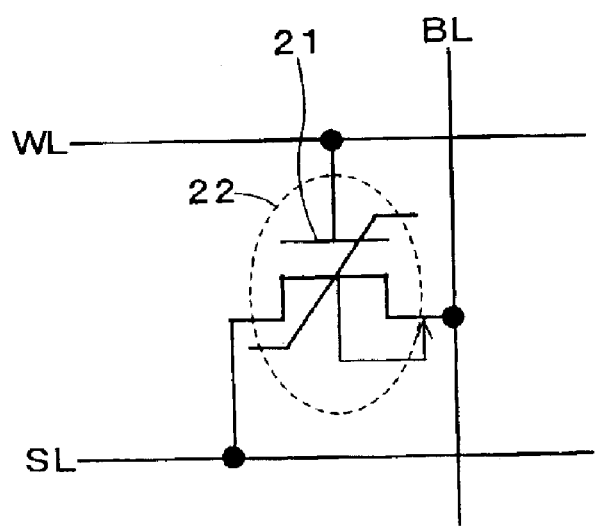
FIG. 22 is an equivalent circuit diagram of a memory cell consisting of the MFSFET shown in FIG. 21.
Figure 23:
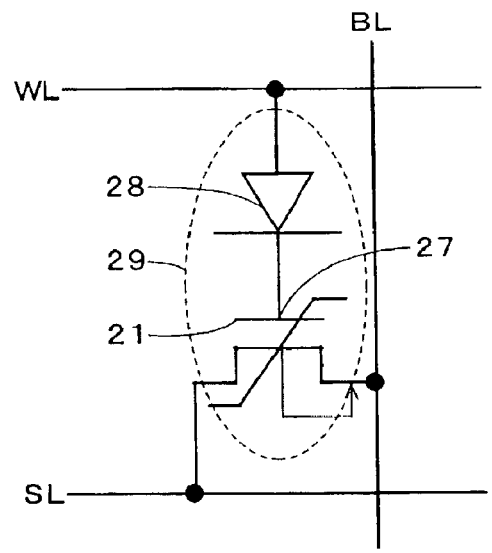
FIG. 23 is an equivalent circuit diagram of a memory cell consisting of the MFSFET and a Zener diode according to the seventh embodiment of the present invention.

FIGS. 21 and 22 show an MFSFET 21 forming each memory cell 22 of an FET-type ferroelectric memory according to the seventh embodiment of the present invention. In the MFSFET 21, n-type impurity regions 24 and 25 are formed on the surface of a p-type semiconductor substrate 23 at a prescribed interval. A gate electrode 27 is formed on a channel region located between the n-type impurity regions 24 and 25 through a ferroelectric film 26. The gate electrode 27 is connected to a word line WL, and the n-type impurity region 24 is connected to a bit line BL. The n-type impurity region 25 is connected to a source line SL. The p-type semiconductor substrate 23 is also connected to the bit line BL.

In the FET-type ferroelectric memory according to the seventh embodiment, the aforementioned MFSFET 21 and a Zener diode 28 are serially connected with each other thereby forming a memory cell 29. According to the seventh embodiment, hysteresis loop of the memory cell 29 deviates in a negative potential direction due to rectification characteristics of the Zener diode 28 so that the FET-type ferroelectric memory applies three types of voltages to bit lines BL1 and BL2 and word lines WL1 and WL2, similarly to the fifth embodiment. In this memory cell 29, the Zener diode 28 and the MFSFET 21 are so formed that potential difference of 2.5 V is required for writing data "1" and potential difference of −5 V is required for writing data "0".

In the memory cell 29 according to the seventh embodiment, further, the center of the hysteresis loop of the memory cell 29 so deviates that the ratio between the absolute value (2.5 V) of the potential difference necessary for writing the data "1" and the absolute value (5 V) of the potential difference necessary for writing the data "0" is 1:2.

Figure 24:
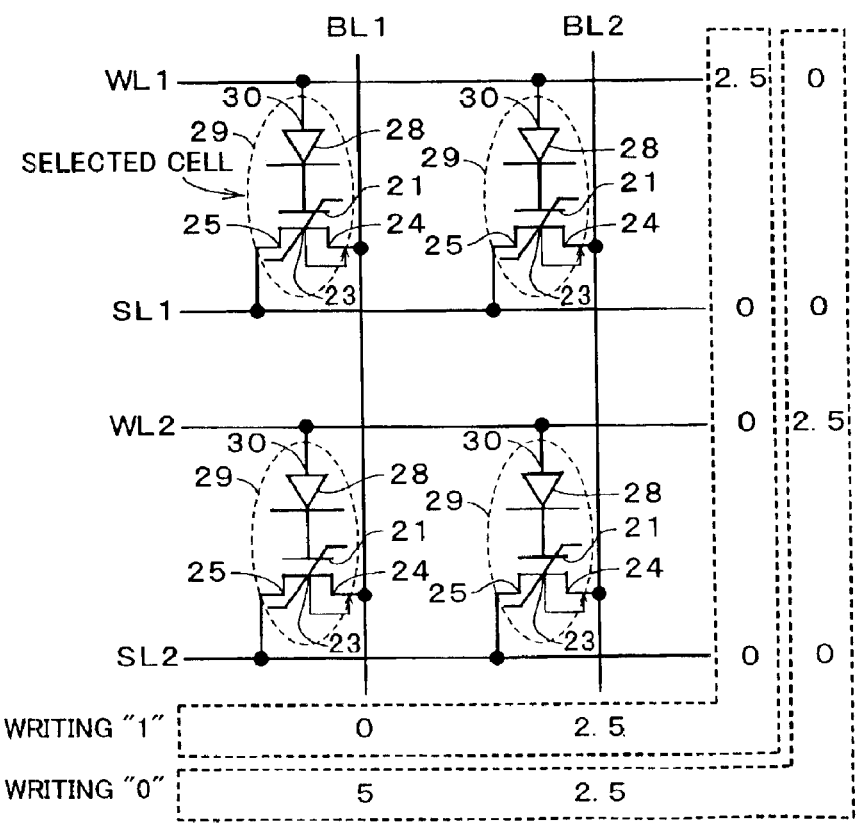
FIG. 24 is a circuit diagram for illustrating a voltage application system in the FET-type ferroelectric memory including the memory cell shown in FIG. 23.
Figure 25:
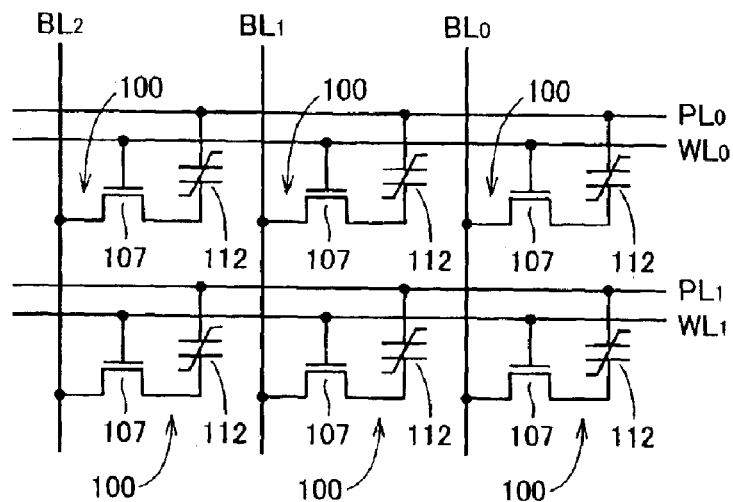
FIG. 25 is a representative circuit diagram of a most generally employed conventional 1T1C type ferroelectric memory.
Figure 26:
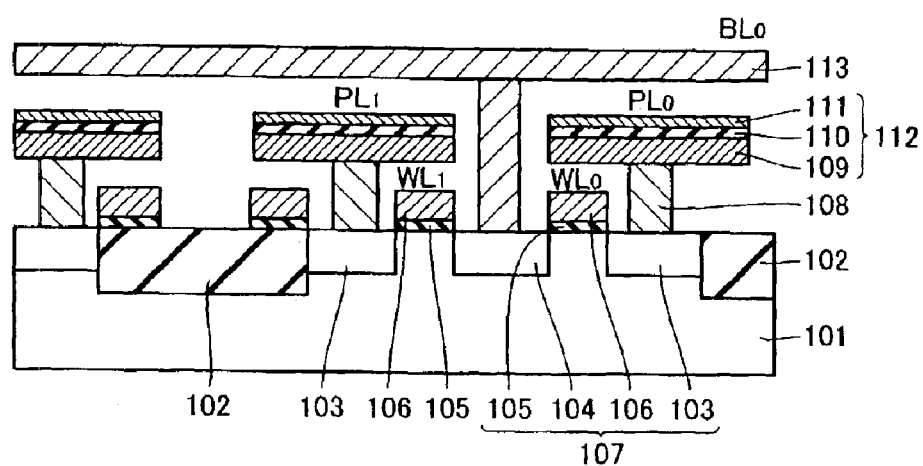
FIG. 26 is a sectional view corresponding to the circuit diagram shown in FIG. 25.
Figure 27:
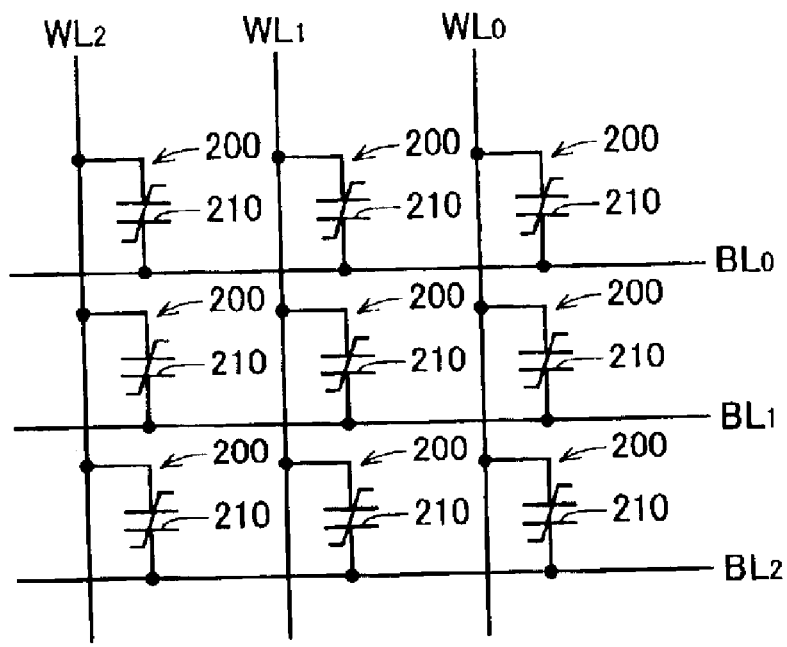
FIG. 27 is a circuit diagram showing the circuit structure of a memory cell array of a conventional simple matrix ferroelectric memory.
Figure 28:
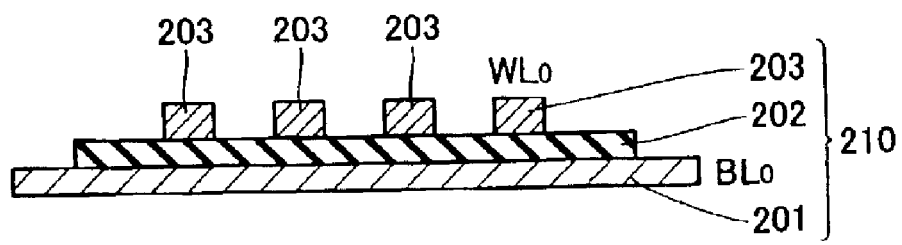
FIG. 28 is a sectional view of the conventional simple matrix ferroelectric memory shown in FIG. 27.
Figure 29:
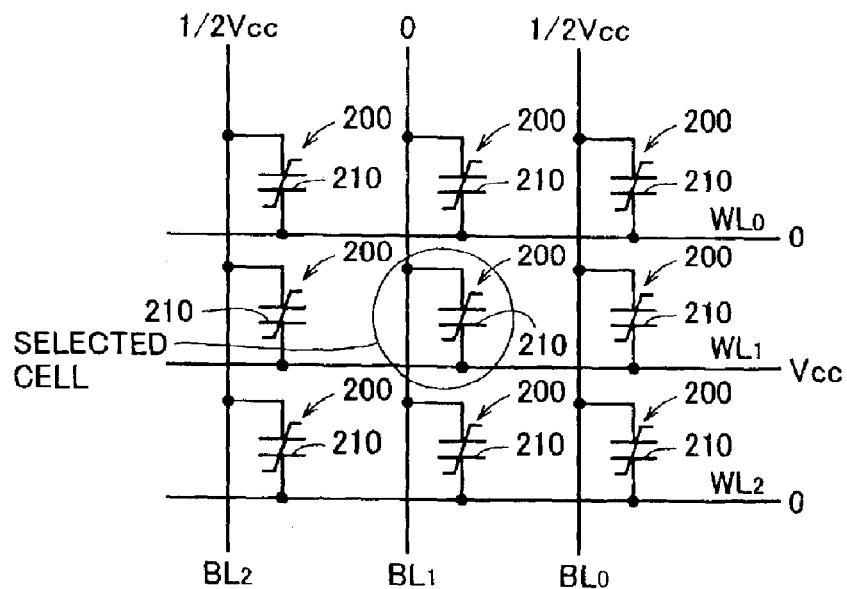
FIG. 29 is a circuit diagram for illustrating a voltage application state in the conventional simple matrix ferroelectric memory shown in FIGS. 27 and 28 in a write operation according to a ½Vcc method.
Figure 30:
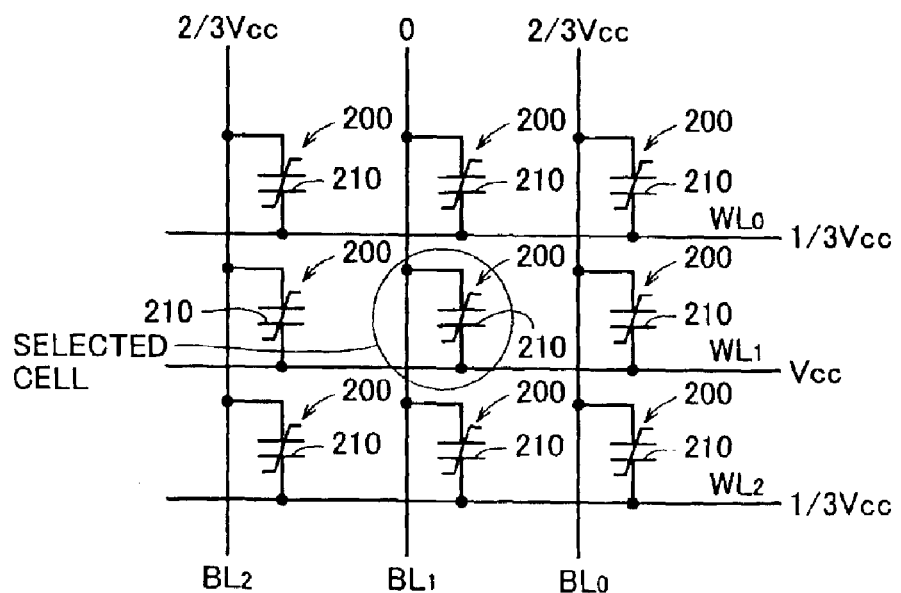
FIG. 30 is a circuit diagram for illustrating a voltage application state in the conventional simple matrix ferroelectric memory shown in FIGS. 27 and 28 in a write operation according to a ⅓Vcc method.
Figure 31:
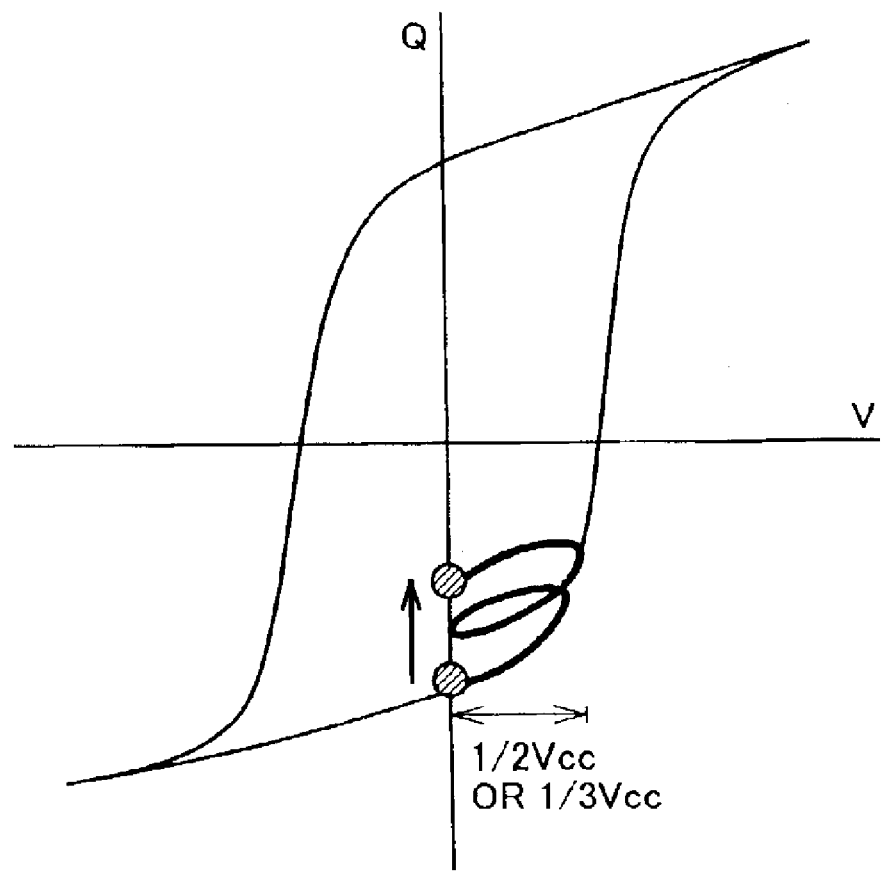
FIG. 31 illustrates ferroelectric hysteresis characteristics for illustrating a problem of the conventional simple matrix ferroelectric memory.

In the FET-type ferroelectric memory according to the seventh embodiment, first terminals 30 of Zener diodes 28 forming memory cells 29 are connected to the word lines WL1 and WL2, while n-type impurity regions 25 of MFSFETs 21 forming the memory cells 29 are connected to source lines SL1 and SL2, as shown in FIG. 24. Further, p-type semiconductor substrates 23 and n-type impurity regions 24 of the MFSFETs 21 are connected with the bit lines BL1 and BL2.

A write operation of the aforementioned FET-type ferroelectric memory according to the seventh embodiment is now described. The FET-type ferroelectric memory regularly applies a voltage of 0 V to the source lines SL1 and SL2 for reading.

In order to write the data "1" in a selected cell 29, the FET-type ferroelectric memory according to the seventh embodiment applies the voltage 0 V to the bit line BL1 while applying the voltage 2.5 V to the word line WL1, as shown in FIG. 24. The FET-type ferroelectric memory further applies the voltage 2.5 V to the bit line BL2 while applying the voltage 0 V to the word line WL2. In this case, the FET-type ferroelectric memory applies the voltage 2.5 V to the selected cell 29. Thus, the FET-type ferroelectric memory writes the data "1" in the selected cell 29.

In order to write the data "0" in the selected cell 29, the FET-type ferroelectric memory applies the voltage 5 V to the bit line BL1 while applying the voltage 0 V to the word line WL1, as shown in FIG. 24. The FET-type ferroelectric memory further applies the voltage 2.5 V to the bit line BL2 as well as to the word line WL2. In this case, the FET-type ferroelectric memory applies a voltage of −5 V to the selected cell 29. Thus, the FET-type ferroelectric memory writes the data "0" in the selected cell 29.

In a read operation, the threshold voltage of the memory cell transistor varies with change of the polarization direction of the ferroelectric film 26 (see FIG. 21) and hence the FET-type ferroelectric memory determines the data "1" or "0" on the basis of change of the threshold voltage.

As hereinabove described, the FET-type ferroelectric memory according to the seventh embodiment displaces the center of the hysteresis loop of each memory cell 29 through the Zener diode 28 for applying three types of voltages 0 V, 2.5 V and 5 V to the bit lines BL1 and BL2 and the word lines WL1 and WL2, whereby a power supply system and a system selectively transmitting potentials generated by the power supply system to the memory cells 29 can be simplified as compared with the conventional ⅓Vcc method requiring four types of voltages. Consequently, the memory device can save the area, increase the speed and reduce the power.

As hereinabove described, further, the FET-type ferroelectric memory according to the seventh embodiment forms each memory cell 29 by serially connecting the MFSFET 21 and the Zener diode 28 with each other, thereby easily displacing the center of the hysteresis loop of the memory cell 29.

Although the present invention has been described and illustrated in detail, it is clearly understood that the same is by way of illustration and example only and is not to be taken by way of limitation, the spirit and scope of the present invention being limited only by the terms of the appended claims.

For example, while each ferroelectric layer 68 is formed by an SBT film in each of the aforementioned second to fourth embodiments, the present invention is not restricted to this but the ferroelectric layer 68 can alternatively be made of $SrBi_2(Nb,Ta)_2O_9$ (SBNT), $Pb(Zr,Ti)O_3$ (PZT), $(Pb, La)(Zr,Ti)O_3$ (PLZT), $(Bi,La)_4Ti_3O_{12}$ (BLT), $Bi_4Ti_3O_{12}$ (BIT) or a ferroelectric material following the same. In particular, any ferroelectric layer is employable so far as the same has a polarization inversion characteristic exhibiting a pulse width causing sufficient polarization inversion when a high voltage is applied thereto while hardly causing polarization inversion when a low voltage is applied thereto as shown in FIG. 6.

While the standby voltage applied to each cell in the standby state is set to (Vt+Vb)/2 in each of the aforementioned first to fourth embodiments, the present invention is not restricted to this but the standby voltage may be in the range of (Vt+Vb)<standby voltage <0. In this case, the standby voltage approaches to the center of the hysteresis loop of the ferroelectric capacitor as compared with that of 0 V, and hence resistance against noise can be improved when performing no writing or reading. However, the standby voltage is most preferably set to (Vt+Vb)/2.

While the ferroelectric memory according to each of the aforementioned fifth to seventh embodiments employs the ferroelectric material as the material having hysteresis, the present invention is not restricted to this but the memory of the present invention may alternatively employ another material so far as the same has hysteresis.

While the ferroelectric memory according to each of the aforementioned fifth to seventh embodiments serially connects the storage means including the ferroelectric film and the diode with each other thereby displacing from 0 V the center of the hysteresis loop of each memory cell, the present invention is not restricted to this but the ferroelectric memory may alternatively displace the center of the hysteresis loop of the memory cell by another method.

While the ferroelectric memory according to each of the aforementioned fifth to seventh embodiments employs the Zener diode for displacing from 0 V the center of the hysteresis loop of the memory cell, the present invention is not restricted to this but the ferroelectric memory may alternatively employ another type of diode.

While the ferroelectric memory according to each of the aforementioned fifth to seventh embodiments displaces from 0 V the center of the hysteresis loop of each memory cell due to the rectification characteristics of the Zener diode, the present invention is not restricted to this but the ferroelectric memory may alternatively employ storage means containing a material exhibiting hysteresis loop having an originally deviating from 0 V center. For example, OYO BUTURI, Vol. 67, No. 11 (1998) pp. 1286–1289 discloses such a material. This literature describes that a BST film exhibiting hysteresis loop having a deviating center can be obtained by epitaxially growing a BST ((Ba,Sr)TiO_3) film on an $SrTiO_2$ (100) single-crystalline substrate by magnetron sputtering. When the ferroelectric memory employs a ferroelectric film consisting of such a material, no Zener diode is required and hence the memory cell structure can be further simplified.

While the ferroelectric memory according to each of the aforementioned fifth to seventh embodiments displaces from 0 V the center of the hysteresis loop of each memory cell so that the ratio between the absolute value of the potential difference applied to the selected cell for writing the data "1" and the absolute value of the potential difference applied to the selected cell for writing the data "0" is 1:2, the present invention is not restricted to this but the ferroelectric memory may alternatively displace the center of the hysteresis loop of the memory cell from 0 V by a prescribed potential for applying only three types of voltages to the bit lines and the word lines.

While the ferroelectric memory according to each of the aforementioned fifth to seventh embodiments writes and reads two data in and from each memory cell, the present invention is not restricted to this but is also applicable to a multivalued memory writing and reading at least three data in and from each memory cell. While the multivalued memory applies more than three types of voltages to bit lines and word lines in this case, the number of the types of the voltages can be reduced as compared with a case of applying the conventional ⅓Vcc method to the multivalued memory.

While each of the aforementioned fifth to seventh embodiments has been described with reference to a ferroelectric memory including ferroelectric films serving as storage means, the present invention is not restricted to this but may alternatively be applied to another memory so far as the same has storage means connected between bit lines and word lines. For example, the present invention is also applicable to a memory having storage means formed by resistive elements.

What is claimed is:

1. A ferroelectric memory comprising:
a bit line;
a word line arranged to intersect with said bit line; and
a memory cell arranged between said bit line and said word line and including a ferroelectric capacitor and a diode serially connected to said ferroelectric capacitor, wherein
said diode is formed by a diode satisfying |Vt|≠|Vb| assuming the Vt and Vb represent a turn-on voltage and a breakdown voltage of said diode respectively.

2. The ferroelectric memory according to claim 1, wherein said diode includes a p-n junction diode formed by a junction of a p-type semiconductor layer and an n-type semiconductor layer.

3. The ferroelectric memory according to claim 2, wherein said p-type semiconductor layer and said n-type semiconductor layer include amorphous layers.

4. The ferroelectric memory according to claim 1, wherein said diode includes a p-n junction diode formed by a junction of a p-type region and an n-type region formed on a semiconductor substrate.

5. The ferroelectric memory according to claim 1, wherein said diode includes a Schottky diode formed by a junction of a conductive layer and a semiconductor layer.

6. The ferroelectric memory according to claim 5, wherein, said conductive layer forming said Schottky diode contains a metal and silicon, and said metal includes at least one metal selected from a group consisting of Ir, Pt, Ru, Re, Ni, Co and Mo.

7. The ferroelectric memory according to claim 5, wherein said conductive layer forming said Schottky diode contains a metal, nitrogen and silicon, and said metal includes at least one metal selected from a group consisting of Ir, Pt, Ru, Re, Ni, Co and Mo.

8. The ferroelectric memory according to claim 5, wherein said semiconductor layer forming said Schottky diode includes an amorphous layer.

9. A ferroelectric memory comprising:
a bit line;
a word line arranged to intersect with said bit line; and
a memory cell arranged between said bit line and said word line and including a ferroelectric capacitor and a diode serially connected to said ferroelectric capacitor,
wherein a voltage is applied in a range hardly feeding a current to said diode to non-selected said memory cell at least either in data writing or in data reading.

10. A ferroelectric memory comprising:
a bit line;
a word line arranged to intersect with said bit line; and
a memory cell arranged between said bit line and said word line and including a ferroelectric capacitor and a diode serially connected to said ferroelectric capacitor,
wherein a standby voltage between said bit line and said word line is in the range of (Vt+Vb)<standby voltage<0 assuming that Vt and Vb represent a turn-on voltage and a breakdown voltage of said diode respectively.

11. A ferroelectric memory according to claim 10, wherein said standby voltage between said bit line and said word line is (Vt+Vb)/2.

12. A ferroelectric memory comprising:
a bit line;
a word line arranged to intersect with said bit line; and
a memory cell arranged between said bit line and said word line and including a ferroelectric capacitor and a diode serially connected to said ferroelectric capacitor,
wherein asymmetrical voltage pulses are applied to said bit line and said word line, thereby performing at least either data writing or data reading.

13. A ferroelectric memory comprising:
a bit line;
a word line arranged to intersect with said bit line;
a memory cell arranged between said bit line and said word line and including a ferroelectric capacitor and a diode serially connected to said ferroelectric capacitor, and
a pulse application means for applying a pulse having a prescribed pulse width causing polarization inversion when applying a voltage whose absolute value is high to said ferroelectric capacitor while causing substantially no polarization inversion when applying a voltage whose absolute value is low to said ferroelectric capacitor to said memory cell, for applying a pulse of a voltage having said prescribed pulse width whose absolute value is high to selected said memory cell while applying a pulse of a voltage having said prescribed pulse width whose absolute value is low to non-selected said memory cell at least either in data writing or in data reading.

14. The ferroelectric memory according to claim 13, wherein said pulse application means includes a pulse application circuit.

15. A ferroelectric memory comprising:
a bit line;
a word line arranged to intersect with said bit line; and
a memory cell arranged between said bit line and said word line and including a ferroelectric capacitor and a diode serially connected to said ferroelectric capacitor,
wherein said diode includes a Schottky diode formed by a junction of a p-type region or an n-type region formed on a semiconductor substrate and a conductive layer formed on said p-type region or said n-type region.

16. An operating method for a ferroelectric memory comprising a bit line, a word line arranged to intersect with said bit line and a memory cell, arranged between said bit line and said word line, including a ferroelectric capacitor and a diode serially connected to said ferroelectric capacitor,
applying asymmetrical voltage pulses to said bit line and said word line thereby writing or reading binary data.

17. The operating method for a ferroelectric memory according to claim 16, wherein a standby voltage between said bit line and said word line is in the range of (Vt+Vb) <standby voltage<0 assuming that Vt and Vb represent a turn-on voltage and a breakdown voltage of said diode respectively.

18. The operating method for a ferroelectric memory according to claim 17, wherein said standby voltage between said bit line and said word line is (Vt+Vb)/2.

19. The operating method for a ferroelectric memory according to claim 17, wherein
said ferroelectric memory further comprises pulse application means for applying a pulse having a prescribed pulse width causing polarization inversion when applying a voltage whose absolute value is high to said ferroelectric capacitor while causing substantially no polarization inversion when applying a voltage whose absolute value is low to said ferroelectric capacitor to said memory cell, for applying a pulse of a voltage having said prescribed pulse width whose absolute value is high to selected said memory cell while applying a pulse of a voltage having said prescribed pulse width whose absolute value is low to non-selected said memory cell at least either in data writing or in data reading.

20. A memory device comprising:
a bit line;
a word line arranged to intersect with said bit line; and
a memory cell, connected to said bit line and said word line, including storage means having hysteresis,
wherein the center of hysteresis loop of said memory cell including said storage means deviates from 0 V by a prescribed potential so that at least three types of voltages are applied to said bit line and said word line.

21. The memory device according to claim 20, wherein said storage means stores two types of data, and the center of said hysteresis loop of said memory cell including said storage means deviates from 0 V by said prescribed potential so that three types of voltages are applied to said bit line and said word line.

22. The memory device according to claim 20, applying positive and negative reverse voltages having substantially identical absolute values from the center of said hysteresis loop deviating from 0 V by said prescribed potential to non-selected said memory cell.

23. The memory device according to claim 20, wherein said storage means includes a ferroelectric film, and said memory cell including said ferroelectric film is arranged between said bit line and said word line.

24. The memory device according to claim 20, wherein said storage means includes a ferroelectric film, and said memory cell including said ferroelectric film is provided on a gate portion of a field-effect transistor.

25. The memory device according to claim 20, wherein said memory cell includes a diode serially connected to said storage means having hysteresis.

26. The memory device according to claim 25, applying a voltage smaller than the absolute value of a breakdown voltage of said diode to non-selected memory cell in data writing and data reading.

27. The memory device according to claim 20, wherein the center of said hysteresis so deviates from 0 V that the absolute value of potential difference applied to selected said memory cell when writing first data and the absolute value of potential difference applied to said selected memory cell when writing second data are in the ratio of about 1:2.

28. The memory device according to claim 20, wherein said storage means includes a ferroelectric film having hysteresis loop whose center deviates from 0 V by a prescribed potential so that at least three types of voltages are applied to said bit line and said word line.

* * * * *